United States Patent
Yoneyama et al.

(10) Patent No.: US 7,205,558 B2
(45) Date of Patent: Apr. 17, 2007

(54) ELECTRON BEAM IRRADIATION APPARATUS, ELECTRON BEAM IRRADIATION METHOD, AND APPARATUS FOR AND METHOD OF MANUFACTURING DISC-SHAPED OBJECT

(75) Inventors: Kenji Yoneyama, Tokyo (JP); Kazushi Tanaka, Tokyo (JP); Mamoru Usami, Tokyo (JP)

(73) Assignee: TDK Corporation, Tokyo (JP)

(*) Notice: Subject to any disclaimer, the term of this patent is extended or adjusted under 35 U.S.C. 154(b) by 0 days.

(21) Appl. No.: 11/335,950

(22) Filed: Jan. 20, 2006

(65) Prior Publication Data

US 2006/0124869 A1 Jun. 15, 2006

Related U.S. Application Data

(62) Division of application No. 11/045,748, filed on Jan. 28, 2005.

(30) Foreign Application Priority Data

Jan. 28, 2004 (JP) .............................. 2004-019681

(51) Int. Cl.
 *G21K 5/10* (2006.01)
(52) U.S. Cl. .................. 250/492.23; 250/306; 369/101; 428/64.4
(58) Field of Classification Search ...................... None
 See application file for complete search history.

(56) References Cited

FOREIGN PATENT DOCUMENTS

JP 20904-110967 A 4/2004
JP 2004-212100 A 7/2004

OTHER PUBLICATIONS

Patent Abstracts of Japan for JP04-019839 published on Jan. 23, 1992.
Patent Abstracts of Japan for JP11-162015 published on Jun. 18, 1999.
Patent Abstracts of Japan for JP07-292470 published on Nov. 7, 1995.
Patent Abstracts of Japan for JP2000-064042 published on Feb. 29, 2000.
Patent Abstracts of Japan for JP2004-110967 published on Apr. 8, 2004.
Patent Abstracts of Japan for JP2004-212100 published on Jul. 29, 2004.

*Primary Examiner*—Nikita Wells
*Assistant Examiner*—Zia R. Hashmi
(74) *Attorney, Agent, or Firm*—Darby & Darby

(57) ABSTRACT

Disclosed are an electron beam irradiation apparatus and an electron beam irradiation method that are capable of easily curing a material that is hard to be cured by irradiation of ultraviolet rays and of reducing the number of electron beam irradiation tubes. The electron beam irradiation apparatus has a motor for rotationally driving an irradiation target object, a shield container for rotatably accommodating the irradiation target object, and an electron beam irradiation unit provided in the shield container so that the surface of the irradiation target object is irradiated with electron beams, wherein the electron beam irradiation unit and the irradiation target object are relatively moved when the electron beam irradiation unit irradiates the surface of the irradiation target object with the electron beams during a rotation of the irradiation target object.

8 Claims, 16 Drawing Sheets

ELECTRON BEAM IRRADIATION APPARATUS, ELECTRON BEAM IRRADIATION METHOD, AND APPARATUS FOR AND METHOD OF MANUFACTURING DISC-SHAPED OBJECT

INCORPORATION BY REFERENCE

This application is a divisional of U.S. patent application Ser. No. 11/045,748 filed Jan. 28, 2005 which claims priority under 35 U.S.C. §119 to Japanese Patent Application No. 2004-019681 filed on Jan. 28, 2004. The content of the applications are incorporated herein by reference, in their entirety.

BACKGROUND OF THE INVENTION

1. Field of the Invention

The present invention relates to an electron beam irradiation apparatus and electron beam irradiation method for irradiating electron beams and to an apparatus for and a method of manufacturing a disc-shaped object.

2. Description of the Prior Art

Optical discs such as a CD (Compact Disc), a DVD (Digital versatile Disc), and the like have hitherto been utilized as optical information recording mediums. Over the recent years, however, there has been a progress of developing a blue semiconductor laser of which an oscillation wavelength is on the order of 400 nm. The development of a next generation high-density optical disc such as a high-density DVD, and the like capable of recording with a higher density than the general DVD, is conducted by use of this type of blue semiconductor laser.

FIG. 13 shows an example of a prior art layer structure of this type of next generation high-density optical disc.

This high-density optical disc is structured such that a recording layer 91 for recording information, a light transmitting layer 92 that transmits laser beams for recording and reproducing so that the laser beams get incident on the recording layer 91 and a protection layer 93 taking contact with a member on the side of an optical pickup into consideration, are stacked in this sequence on a substrate 90 composed of a resin material such as polycarbonate. The light transmitting layer 92 and the protection layer 93 are, when formed, irradiated with ultraviolet rays after being coated for curing. When especially the protection layer, etc. is formed of a material such as silicon compound, fluorine compound, etc. that exhibit radial polymerization double-bond, however, there might be a case in which a characteristic as the protection layer, etc. deteriorates unless a reaction initiator is added thereto in such a case, and the protection layer is hard to be cured by the irradiation of the ultraviolet rays, with the result that the protection layer having a sufficient quality can not be formed (refer to Japanese Patent Laid-Open Application Publication No.4-019839, Japanese Patent Laid-Open Application Publication No.11-162015, Japanese Patent Laid-Open Application Publication No.7-292470, Japanese Patent Laid-Open Application Publication No.2000-64042).

For solving the problems inherent in the prior arts given above, the present inventors cooperating with other inventors proposed an electron beam irradiation apparatus and an electron beam irradiation method in Japanese Patent Application No.2002-274120, which are capable of efficiently irradiating electron beams, of which an acceleration voltage is on the order of 20 kV through 100 kV while rotating a disc substrate, exhibiting consequently greater energy than the ultraviolet rays have, and of easily curing the protection layer, etc. such as a lubricating layer, etc. that is hard to be cured by the irradiation of the ultraviolet rays. In this case, a plurality of electron beam irradiation tubes are disposed for irradiating uniformly the whole disc substrate with the electron beams.

If the electron beam irradiation apparatus involves using the plurality of electron beam irradiation tubes, the apparatus increases both in weight and in size, an equipment cost rises because of the electron beam irradiation tube being comparatively expensive, and a running cost increases with a rise in amounts of consumption of an $N_2$ gas for cooling and of electric power. A manufacturing cost increases due to these factors.

SUMMARY OF THE INVENTION

It is an object of the present invention to provide an electron beam irradiation apparatus and an electron beam irradiation method that are capable of easily curing a material that is hard to be cured by irradiation of ultraviolet rays and of reducing the number of electron beam irradiation tubes to be used.

It is another object of the present invention to provide an apparatus for and a method of manufacturing a disc-shaped object that are capable of forming a layer having functionability on the disc-shaped object efficiently and at a low cost by use of a material that is hard to be cured by the irradiation of the ultraviolet rays.

An electron beam irradiation apparatus according to an embodiment comprises a rotary driving unit for rotationally driving an irradiation target object, a shield container for rotatably accommodating the irradiation target object, and an electron beam irradiation unit provided in the shield container so that the surface of the irradiation target object is irradiated with electron beams, wherein the electron beam irradiation unit and the irradiation target object are relatively moved when the electron beam irradiation unit irradiates the surface of the irradiation target object with the electron beams during a rotation of the irradiation target object. Herein, the relative movement described above does not imply a rotation of the irradiation target object.

According to this electron beam irradiation apparatus, the surface of the non-rotating irradiation target object is irradiated with the electron beams, and it is therefore possible to efficiently irradiate the surface of the irradiation target object with the electron beams having greater energy than ultraviolet rays have. Hence, for example, it is feasible to cure a layer having functionability and using a material that is hard to be cured by the irradiation of the ultraviolet rays, and the electron beam irradiation unit can be constructed of, for instance, fewer electron beam irradiation tubes because of making the relative movements of the electron beam irradiation unit and the irradiation target object when performing such irradiation of the electron beams, thus enabling the number of electron beam irradiation tubes to be reduced. Herein, the term "functionability" implies lubricity, anti-static property, anti-fouling property, hardness, abrasion resistance, and so on. The following discussion will be made by exemplifying the lubricity.

The electron beam irradiation apparatus can be constructed so that a width of the electron beam irradiation unit in a direction orthogonal to a rotating direction of the irradiation target object within a rotating plane of the irradiation target object, is smaller than a maximum distance from the center of rotation within the rotating plane of the irradiation target object. Namely, when the irradiation target surface of the irradiation target object takes a disc-like shape, even if the width of the electron beam irradiation unit in the direction orthogonal to the rotating direction of the irradiation target object within the rotating plane of the irradiation target object, is smaller than a radius of the irradiation target object, substantially the entire surface of the irradiation target object can be irradiated with the electron beams owing to the relative movements described above. Further, when the irradiation target surface of the irradiation target object takes a non-disc-like shape such as a polygonal shape, etc., even if the width of the electron beam irradiation unit in the aforementioned direction is smaller than a maximum distance (which is a maximum radius of a circle defined by a rotation within the rotating plane) from the center of the rotation within the rotating plane of the irradiation target object, substantially the entire surface of the irradiation target object can be irradiated with the electron beams owing to the aforementioned relative movements.

Moreover, the electron beam irradiation apparatus can be constructed so that a rotating speed of the irradiation target object is changed corresponding to a position of the irradiation by the electron beam irradiation unit over the irradiation target object. In this case, the rotating speed of the irradiation target object is decreased when the electron beam irradiation unit irradiates an outer periphery side of the irradiation target object with the electron beams and is increased when irradiating an inner periphery side with the electron beams, whereby an electron beam absorbed dose of the irradiation target object can be set fixed irrespective of the position of the irradiation target object. Note that in this case, the electron beam irradiation apparatus can be constructed so as to move the irradiation target object with respect to the electron beam irradiation unit and may also be constructed so as to move the electron beam irradiation unit with respect to the irradiation target object. Furthermore, both of the electron beam irradiation unit and the irradiation target object may be moved relatively.

Further, the electron beam irradiation apparatus can be constructed so that a moving velocity of the electron beam irradiation unit is changed corresponding to the position of the irradiation by the electron beam irradiation unit over the irradiation target object. For example, in the case of moving the electron beam irradiation unit with respect to the irradiation target object, the moving velocity of the electron beam irradiation unit is decreased when the electron beam irradiation unit irradiates the outer periphery side of the irradiation target object with the electron beams and is increased when irradiating the inner periphery side with the electron beams, whereby the electron beam absorbed dose of the irradiation target object can be set fixed irrespective of the position of the irradiation target object.

The electron beam irradiation unit can be constructed of an irradiation window of a single electron beam irradiation tube. Note that the irradiation target object preferably takes the disc-like shape and is irradiated with the electron beams in a way that moves an irradiation target area on the irradiation target object sequentially in the radial direction of the irradiation target object through the relative movements of the electron beam irradiation unit and the irradiation target object, whereby an irradiation required area on the irradiation target object can be irradiated with the electron beams.

An electron beam irradiation method according to the present embodiment comprises the steps of rotationally driving an irradiation target object accommodated in a shield container that can be said air-tight, and making relative movements of the electron beam irradiation unit and the irradiation target object when the electron beam irradiation unit irradiates the surface of the on-rotating irradiation target object with the electron beams.

According to this electron beam irradiation method, the surface of the on-rotating irradiation target object is irradiated with the electron beams, and therefore the surface of the irradiation target object can be efficiently irradiated with the electron beams having the greater energy than the ultraviolet rays have. Hence, for example, it is feasible to easily cure a lubricating layer exhibiting, etc. made of a material that is hard to be cured by the irradiation of the ultraviolet rays, and at the same time the electron beam irradiation unit can be constructed of a less number of electron beam irradiation tubes because of making the relative movements of the electron beam irradiation unit and the irradiation target object when performing such irradiation of the electron beams, thus enabling the number of electron beam irradiation tubes to be reduced.

In the electron beam irradiation method, it is preferable that a rotating speed of the irradiation target object is changed corresponding to a position of the irradiation by the electron beam irradiation unit over the irradiation target object. In this case, the rotating speed of the irradiation target object is decreased when the electron beam irradiation unit irradiates an outer periphery side of the irradiation target object with the electron beams and is increased when irradiating an inner periphery side with the electron beams, whereby an electron beam absorbed dose of the irradiation target object can be set fixed irrespective of the position of the irradiation target object.

Moreover, it is preferable that a moving velocity of the electron beam irradiation unit is changed corresponding to the position of the irradiation by the electron beam irradiation unit over the irradiation target object. In this case, the moving velocity of the electron beam irradiation unit is decreased when the electron beam irradiation unit irradiates the outer periphery side of the irradiation target object with the electron beams and is increased when irradiating the inner periphery side with the electron beams, whereby the electron beam absorbed dose of the irradiation target object can be set fixed irrespective of the position of the irradiation target object.

An apparatus for manufacturing a disc-shaped object according to the present embodiment comprises the aforementioned electron beam irradiation apparatus, wherein the disc-shaped object serving as the irradiation target object is formed with a layer having functionability, which is cured by the irradiation of the electron beams.

According to this disc-shaped object manufacturing apparatus, the on-rotating disc-shaped object is irradiated with the electron beams, and it is therefore possible to efficiently irradiate the disc-shaped object with the electron beams having the greater energy than the ultraviolet rays have. Hence, the lubricating layer, etc. made of the material that is hard to be cured by the irradiation of the ultraviolet rays can be easily cured and efficiently formed on the disc-shaped object. Further, the electron beam irradiation unit can be constructed of a less number of electron beam irradiation tubes because of making the relative movements of the electron beam irradiation unit and the disc-shaped object when performing such irradiation of the electron beams, thus enabling the number of electron beam irradiation tubes to be reduced. Then, the equipment cost and the running cost can be reduced, and the lubricating layer, etc. can be formed at a low cost.

A method of manufacturing a disc-shaped object according to the present embodiment involves using the aforementioned electron beam irradiation apparatus or the aforementioned electron beam irradiation method, wherein the disc-shaped object serving as the irradiation target object is formed with a layer having functionability, which is cured by the irradiation of the electron beams.

According to this disc-shaped object manufacturing method, the on-rotating disc-shaped object is irradiated with the electron beams, and it is therefore possible to efficiently irradiate the disc-shaped object with the electron beams having the greater energy than the ultraviolet rays have. Hence, the lubricating layer, etc. made of the material that is hard to be cured by the irradiation of the ultraviolet rays can be easily cured and efficiently formed on the disc-shaped object. Further, the electron beam irradiation unit can be constructed of a less number of electron beam irradiation tubes because of making the relative movements of the electron beam irradiation unit and the disc-shaped object when performing such irradiation of the electron beams, thus enabling the number of electron beam irradiation tubes to be reduced. Then, the equipment cost and the running cost can be reduced, and the lubricating layer, etc. can be formed at a low cost.

Another apparatus for manufacturing a disc-shaped object according to the present embodiment comprises an electron beam irradiation apparatus including a first rotational unit provided in an openable/closable shield container and accommodating a disc-shaped object rotationally driven, and an electron beam irradiation unit for irradiating the surface of the on-rotating disc-shaped object with electron beams, a chamber including a second rotational unit capable of accommodating the disc-shaped object and an exchange chamber that is air-tight and openable/closable independently of the shield container, and a rotational unit for exchanging the first and second rotational units with each other by rotating the first rotational unit in the shield container and the second rotational unit in the exchange chamber, wherein the electron beam irradiation unit and the disc-shaped object are relatively moved when irradiating the on-rotating disc-shaped object with the electron beams.

According to this disc-shaped object manufacturing apparatus, the on-rotating disc-shaped object is irradiated with the electron beams, and it is therefore possible to efficiently irradiate the disc-shaped object with the electron beams having the greater energy than the ultraviolet rays have. Hence, for example, the lubricating layer, etc. made of the material that is hard to be cured by the irradiation of the ultraviolet rays can be easily cured. Further, the two pieces of first and second rotational units are exchanged with each other by rotating the first rotational unit and the second rotational unit, thus ejecting the post-irradiation disc-shaped object and simultaneously supplying the pre-irradiation disc-shaped object. The two disc-shaped objects can be efficiently exchanged, thereby improving the productivity. At the same time, the electron beam irradiation unit can be constructed of a less number of electron beam irradiation tubes because of making the relative movements of the electron beam irradiation unit and the disc-shaped object when performing the irradiation of the electron beams, thus enabling the number of electron beam irradiation tubes to be reduced. Then, the equipment cost and the running cost can be reduced, and the lubricating layer, etc. can be formed at a low cost.

The disc-shaped object manufacturing apparatus can be constructed so that a width of the electron beam irradiation unit in a direction orthogonal to a rotating direction of the irradiation target object within a rotating plane of the disc-shaped object, is smaller than a radius of the disc-shaped object.

Moreover, in the disc-shaped object manufacturing apparatus, it is preferable that a rotating speed of the disc-shaped object is changed corresponding to a position of the irradiation by the electron beam irradiation unit over the disc-shaped object. In this case, the first rotational unit and the second rotational unit are so constructed as to be capable of revolving, and the first rotational unit irradiates the surface of the on-rotating disc-shaped object with the electron beams from the electron beam irradiation unit, whereby the disc-shaped object can be moved with respect to the electron beam irradiation unit. Moreover, the rotating speed of the disc-shaped object is decreased when the electron beam irradiation unit irradiates an outer periphery side of the disc-shaped object with the electron beams and is increased when irradiating an inner periphery side with the electron beams, whereby the electron beam absorbed dose of the disc-shaped object can be set fixed irrespective of the position of the disc-shaped object.

Further, it is preferable that a moving velocity of the electron beam irradiation unit is changed corresponding to the position of the irradiation by the electron beam irradiation unit over the disc-shaped object. In this case, the moving velocity of the electron beam irradiation unit is decreased when the electron beam irradiation unit irradiates the outer periphery side of the disc-shaped object with the electron beams and is increased when irradiating the inner periphery side with the electron beams, whereby the electron beam absorbed dose of the disc-shaped object can be set fixed irrespective of the position of the disc-shaped object. Moreover, the electron beam irradiation unit can be constructed of an irradiation window of a single electron beam irradiation tube.

DETAILED DESCRIPTION OF THE PREFERRED EMBODIMENTS

A best mode for carrying out the present invention will hereinafter be described with reference to the drawings. Namely, an electron beam irradiation apparatus according to a first embodiment, and an apparatus for manufacturing a disc-shaped medium according to a second embodiment and a third embodiment will be explained with reference to the drawings.

The electron beam irradiation apparatus in the first embodiment is constructed to irradiate a disc-shaped irradiation target object with electron beams while moving a single electron beam irradiation tube.

Figure 1:
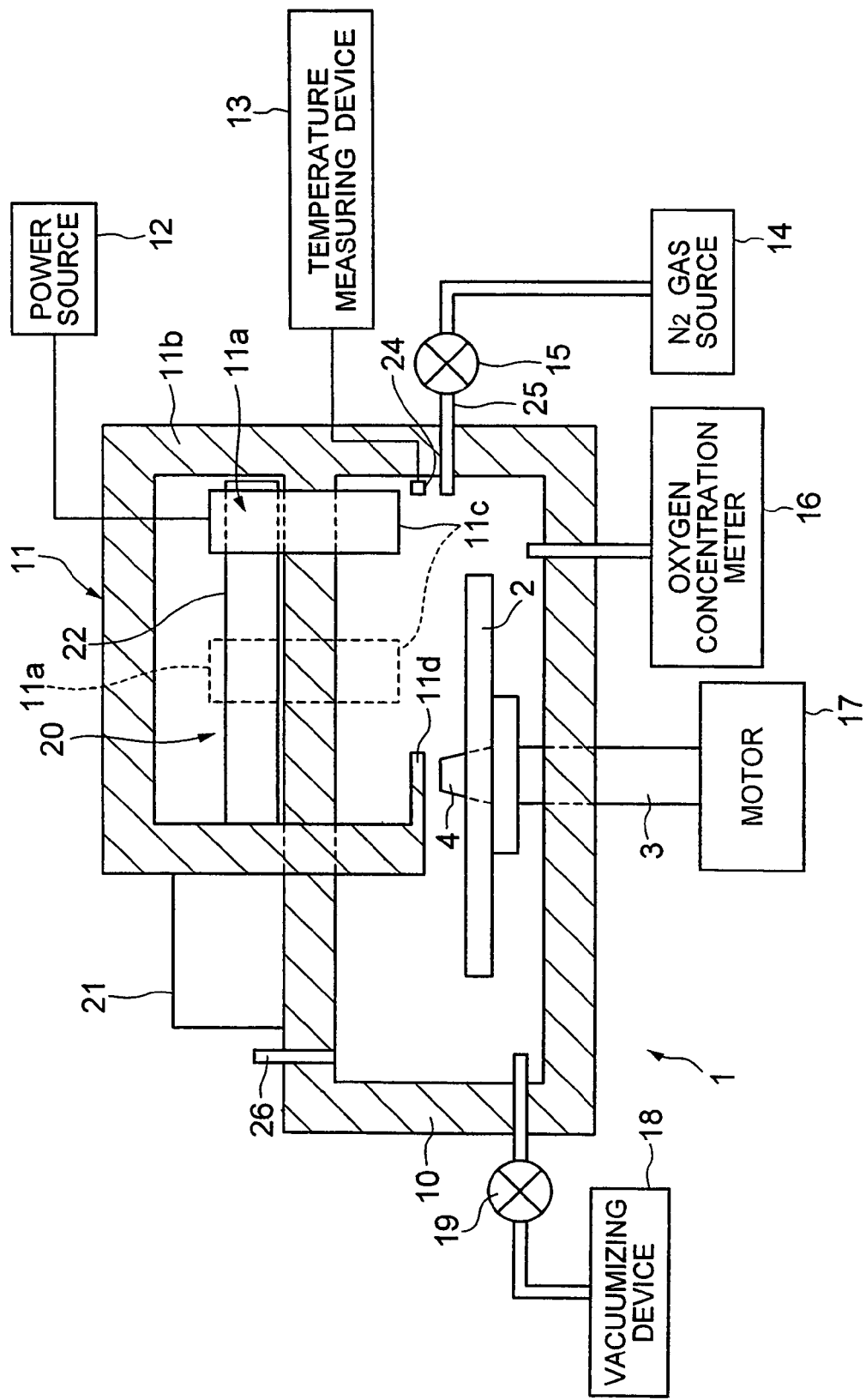
FIG. 1 is a side view schematically showing an electron beam irradiation apparatus in a first embodiment.
Figure 2:
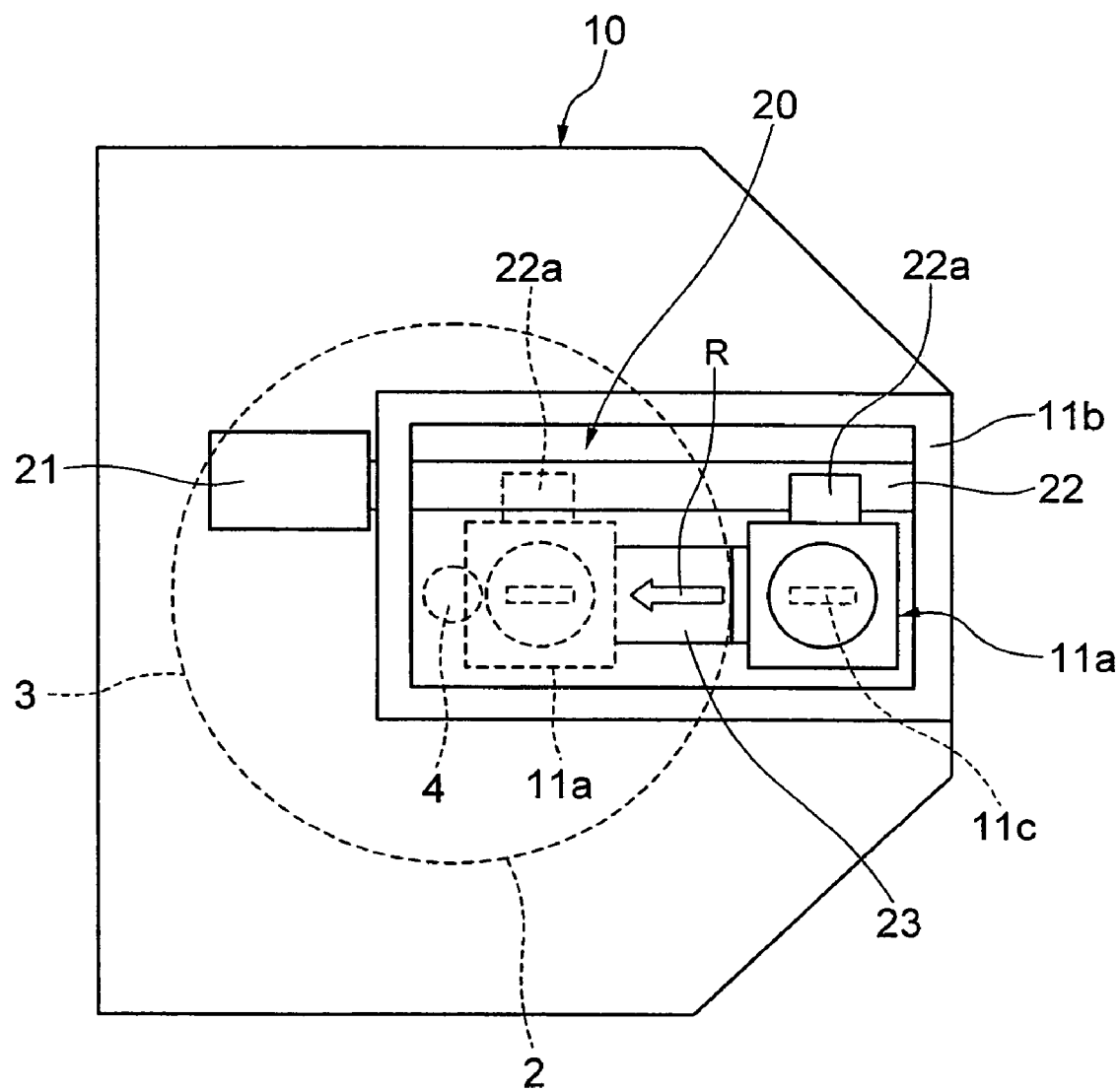
FIG. 2 is a plan view of the principal portions of the electron beam irradiation apparatus in FIG. 1.
Figure 3:
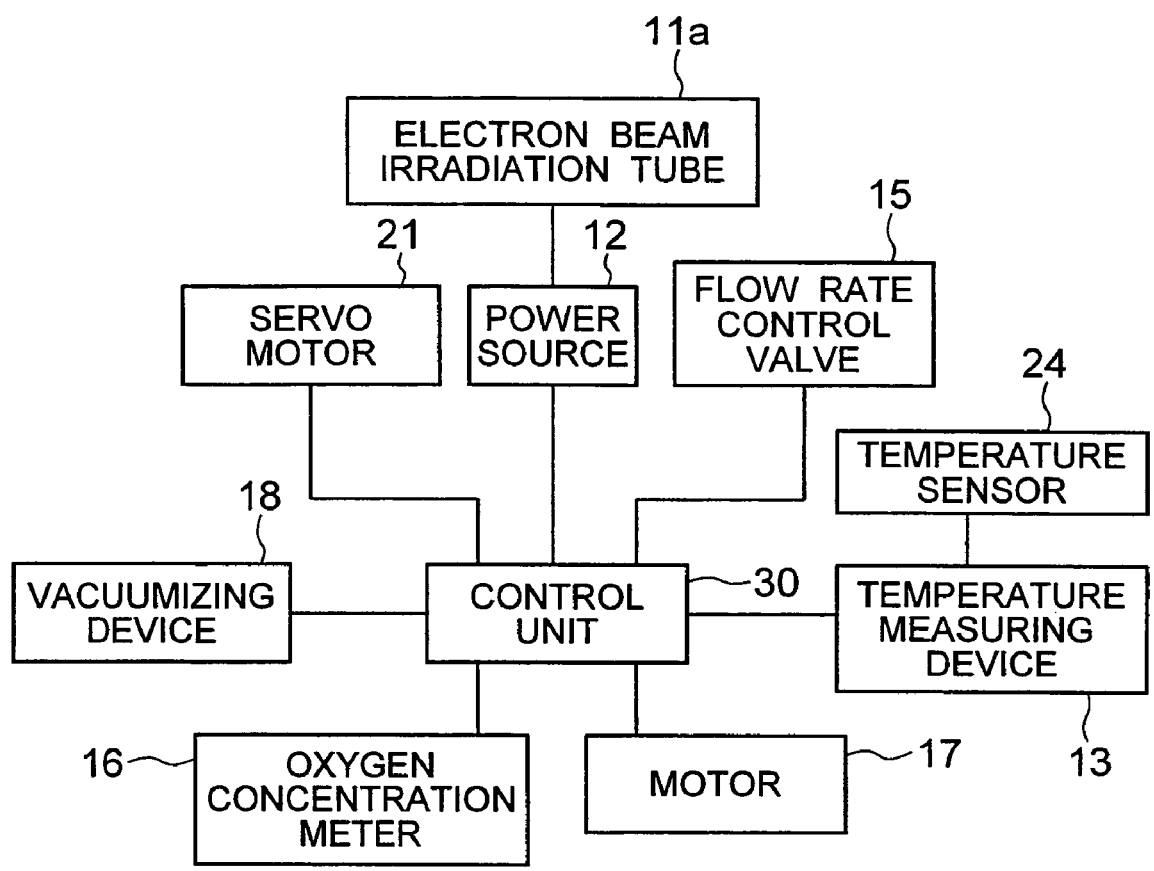
FIG. 3 is a block diagram showing a control system of the electron beam irradiation apparatus in FIG. 1.
Figure 4:
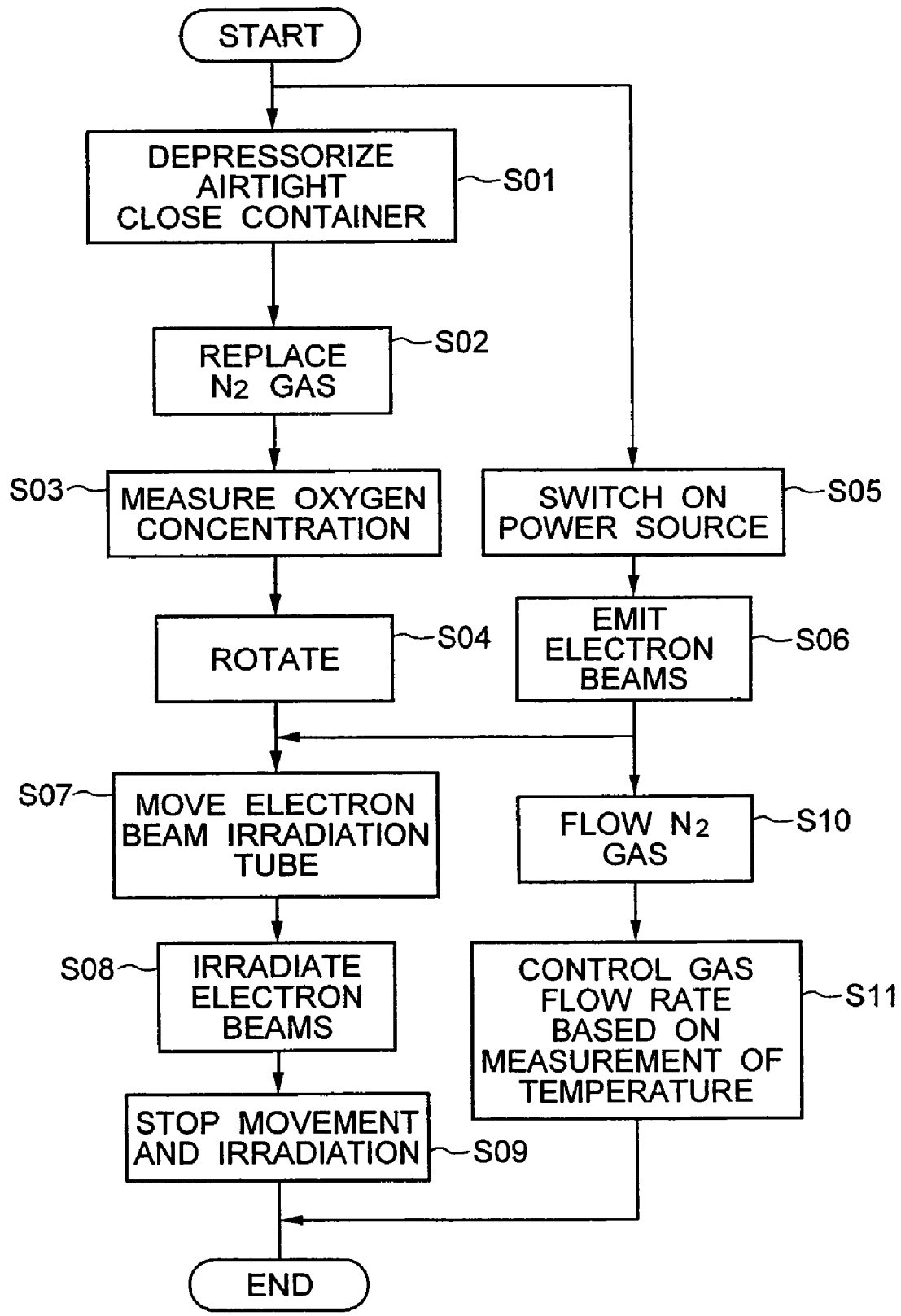
FIG. 4 is a flowchart showing an operation of the electron beam irradiation apparatus in FIGS. 1 through 3.
Figure 5:
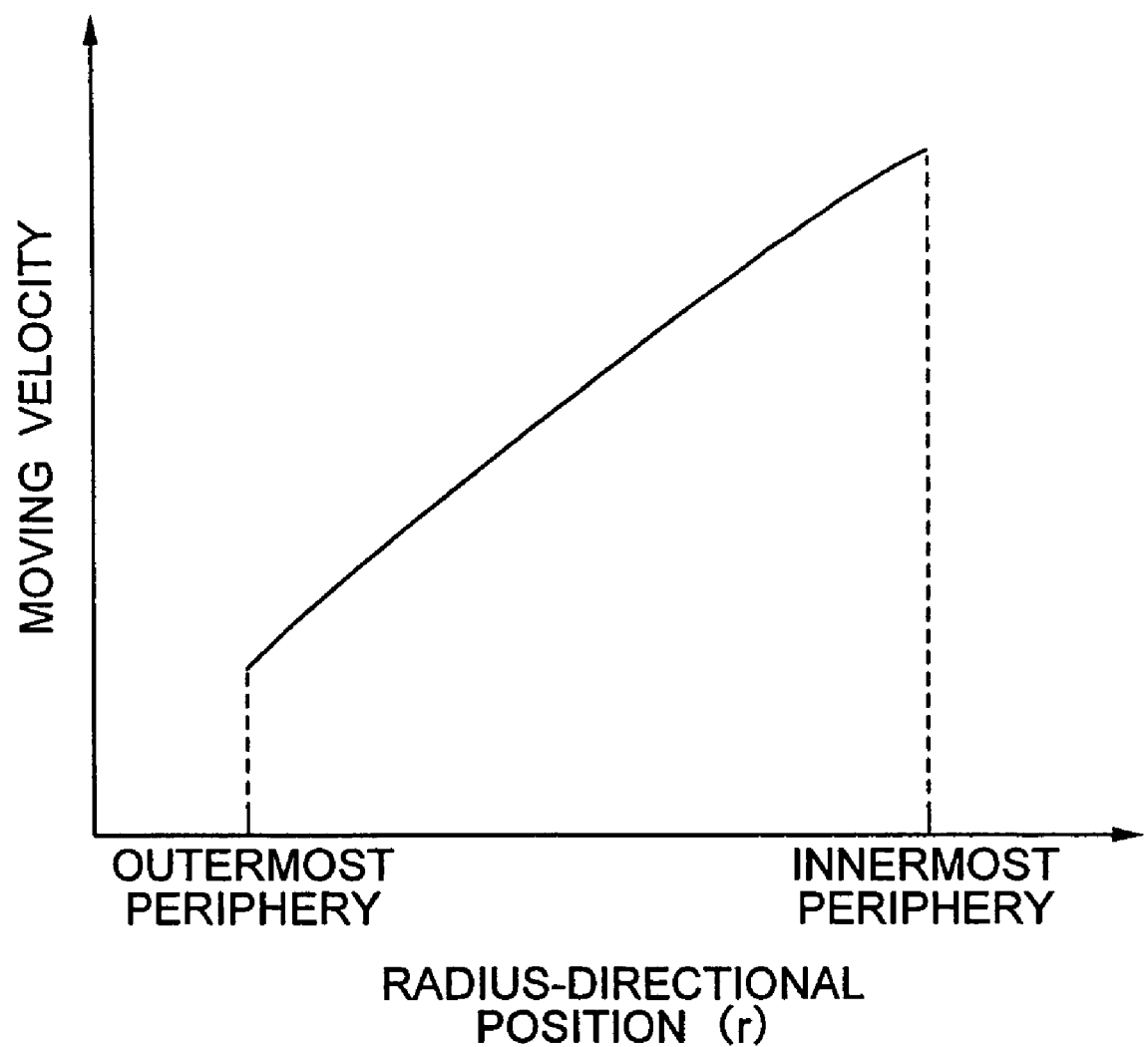
FIG. 5 is a graph schematically showing a relation between a radius-directional position of an electron beam irradiation tube 11a and a moving velocity of an electron beam irradiation tube 11a of the electron beam irradiation apparatus in FIGS. 1 through 3.
Figure 17:
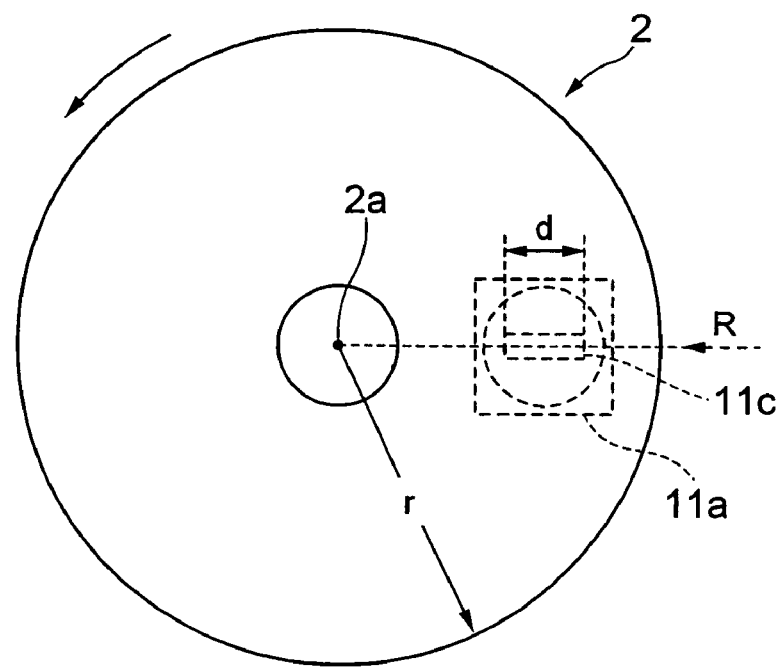
FIG. 17 is a plan view showing a positional relation in plane between an on-rotating disc-shaped irradiation target object and the electron beam irradiation tube in the electron beam irradiation apparatus in FIGS. 1 and 2.

FIG. 1 is a side view schematically showing the electron beam irradiation apparatus in the first embodiment. FIG. 2 is a plan view of the principal portions of the electron beam irradiation apparatus in FIG. 1. FIG. 3 is a block diagram showing a control system of the electron beam irradiation apparatus in FIG. 1. FIG. 4 is a flowchart showing an operation of the electron beam irradiation apparatus in FIGS. 1 through 3. FIG. 5 is a graph schematically showing a relation between a radius-directional position of an electron beam irradiation tube 11a and a moving velocity of the electron beam irradiation tube 11a of the electron beam irradiation apparatus in FIGS. 1 through 3. FIG. 17 is a plan view showing a positional relation in plane between the on-rotating disc-shaped irradiation target object and the electron beam irradiation tube in the electron beam irradiation apparatus in FIGS. 1 and 2.

As illustrated in FIG. 1, an electron beam irradiation apparatus 1 includes a shield container 10 that accommodates a disc-shaped irradiation target object 2 rotatably and is composed of stainless steel in order to shield the electron beams (to confine the electron beams to the inside), a motor 17 for rotationally driving the irradiation target object 2 held by engaging a central hole of the irradiation target object 2 with an engaging member 4 through a rotary shaft 3, the electron beam irradiation tube 11a that emits the electron beams under a low-acceleration voltage, an electron beam irradiating portion 11c, constructed of an irradiation window of the electron beam irradiation tube 11a, from which to irradiate the irradiation target object 2 with the electron beams, a power source 12 for applying a voltage to the electron beam irradiation tube 11a, and a temperature measuring device 13 for measuring an ambient temperature to the electron beam irradiation tube 11a by use of a temperature sensor 24 disposed in the vicinity of the electron beam irradiation tube 11a.

The electron beam irradiation apparatus 1 further includes an oxygen concentration meter 16 for measuring an oxygen concentration of oxygen in an airtight closed space within the shield container 10, a vacuumizing device 18 for evacuating and thus depressurizing an interior of the shield container 10 via a valve 19, a nitrogen gas source 14 that supplies a nitrogen gas for replacing the interior of the shield container 10 with a nitrogen gas atmosphere, and a gas flow rate control valve 15 capable of controlling a gas flow rate of the nitrogen gas in a such flow that the nitrogen gas is supplied from the nitrogen gas source 14, introduced via a gas introduction port 25, passes through in the vicinity of the irradiation window 11c and is discharged from a gas discharge port 26. Further, the gas discharge port 26 is provided with a valve (unillustrated).

As shown in FIGS. 1 and 2, the electron beam irradiation apparatus 1 is equipped with a moving mechanism 20 for moving the electron beam irradiation tube 11a in a radial direction R of the irradiation target object 2, and with an irradiation tube container 11b disposed in a upper part of the shield container 10 and accommodating the electron beam irradiation tube 11a inwardly. The electron beam irradiation tube 11a irradiates the electron beams of which an acceleration voltage is on the order of 20 kV through 100 kV from the elongated irradiation window (i.e., the electron beam irradiating portion 11c) disposed along the radial direction R of the irradiation target object 2 in FIGS. 1, 2 and 17. The irradiation window (the electron beam irradiating portion) 11c of the electron beam irradiation tube 11a has a width d along the radial direction R that is smaller than a radius r (a distance from a rotational center 2a up to an outer periphery) of the disc-shaped irradiation target object 2 in FIG. 17.

As shown in FIG. 2, an upper surface of the shield container 10 within the irradiation tube container 11b is formed with an elongated aperture 23 in and along which the electron beam irradiation tube 11a is disposed and movable. The irradiation tube container 11b is, as in the case of the shield container 10, composed of the stainless steel so that the electron beams do not leak out of the aperture 23, thus shielding the electron beams.

The moving mechanism 20 includes a servo motor 21 disposed on the upper surface of the shield container 10 outwardly of the irradiation tube container 11b, and a ball slide shaft 22 connected to the electron beam irradiation tube 11a within the irradiation tube container 11b and rotationally driven by the servo motor 21. The servo motor 21 can rectilinearly move the electron beam irradiation tube 11a along the aperture 23 by rotationally driving the ball slide shaft 22, and can adjust the moving velocity of the electron beam irradiation tube 11a by controlling the number of revolutions of the servo motor 21. The moving mechanism 20 moves the electron beam irradiation tube 11a in the radial direction R, thereby enabling the irradiation of the electron beams over substantially the entire surface of the irradiation target object 2 by use of the electron beam irradiation tube 11a having the irradiation window 11c of which the width d is smaller than the radius r of the irradiation target object 2 in FIG. 17.

The electron beam irradiation tube 11a, when the voltage is applied to this tube 11a from the power source 12, irradiates part of an area of the on-rotating irradiation target object 2 with the electron beams of which the acceleration voltage is on the order of 20 kV through 100 kV via the irradiation window 11c. In this case, however, a control unit 30 in FIG. 3 keeps constant the rotating speed of the irradiation target object 2, and controls the servo motor 21 of the moving mechanism 20, as shown in FIG. 5, so as to decrease the moving velocity of the electron beam irradiation tube 11a when the electron beam irradiation tube 11a irradiates an outer peripheral side of the irradiation target object 2 with the electron beams and so as to increase the moving velocity of the electron beam irradiation tube 11a when irradiating an inner peripheral side with the electron beams. With this control thus effected, an electron beam absorbed dose of the irradiation target object 2 can be fixed irrespective of the radius-directional position of the irradiation target object 2.

The thus-constructed electron beam irradiation apparatus 1 in FIGS. 1 and 2, irradiates the electron beams in a way that controls the whole as shown in FIG. 3 by the control unit 30. Respective steps S01 through S11 of the operation of the electron beam irradiation apparatus 1 will be described with reference to FIG. 4.

Under the control of the control unit 30, to begin with, after closing the valve at the gas discharge port 26, the vacuumizing device 18 operates to depressurize the interior of the shield container 10 (S01), then the valve 19 is closed, and the nitrogen gas is introduced into the shield container 10 via a gas flow rate control valve 15 from the nitrogen gas source 14 (S02). The interior of the shield container 10 can be thereby easily replaced with a nitrogen atmosphere.

Then, the oxygen concentration meter 16 detects a decrease down to a predetermined oxygen concentration in the interior of the shield container 10 (S03), and the irradiation target object 2 is rotated at a predetermined rotating speed by driving the motor 17 (S04). On the other hand, the voltage is applied to the electron beam irradiation tube 11a from the power source 12 (S05), thereby generating the electron beams (S06). At this time, the electron beam irradiation tube 11a is positioned by far more outwards than the outermost periphery of the irradiation target object 2 as depicted by the solid lines in FIGS. 1 and 2.

Next, the ball slide shaft 22 is rotated by driving the servo motor 21, whereby the electron beam irradiation tube 11a is moved towards the inner periphery side in the radial direction R up to a position indicated by a broken line in FIGS. 1 and 2 from the position depicted by the solid lines in FIGS. 1 and 2 (S07). In the meantime, the surface of the on-rotating irradiation target object 2 is irradiated with the electron beams emitted from the irradiation window 11c of the electron beam irradiation tube 11a (S08). During the thus-effected irradiation of the electron beams, the electron beam irradiation tube 11a is moved towards the innermost periphery side from the outer periphery side of the irradiation target object 2, and the moving velocity thereof in the radial direction R is so controlled as to change from a low velocity to a high velocity as shown in FIG. 5. Therefore, the electron beam absorbed dose of the on-rotating irradiation target object 2 can be fixed regardless of the radius-directional position of the irradiation target object 2.

Then, when the electron beam irradiation tube 11a is moved to the vicinity of the rotational center of the irradiation target object 2 in alignment with the position of an edge portion 11d extending so as to provide an eaved-cover above the engaging member 4 from the irradiation tube container 11b, the electron beam irradiation tube 11a stops moving, and simultaneously the irradiation of the electron beams from the electron beam irradiation tube 11a is stopped (S09).

Further, during the emission of the electron beams from the electron beam irradiation tube 11a, the nitrogen gas from the nitrogen gas source 14 flows through the vicinity of the irradiation window 11c via the gas introduction portion 25 and further flows into the gas discharge portion 26 (S10), thereby making it possible to cool off the irradiation window 11c that rises in its temperature when emitting the electron beams. Moreover, a temperature ambient to the irradiation window 11c is measured by a temperature sensor 24 and by a temperature measuring device 13, and a flow rate of the nitrogen gas is controlled based on this measured temperature by the gas flow rate control valve 15 (S11). The temperature ambient to the irradiation window 11c can be controlled to be equal to or lower than a fixed temperature.

As described above, according to the electron beam irradiation apparatus in FIGS. 1 through 4, the surface of the on-rotating irradiation target object 2 is irradiated with the electron beams, thereby enabling highly efficient irradiation of the electron beams exhibiting greater energy than the ultraviolet rays have. It is therefore feasible to facilitate curing of a lubricating layer, etc. made of a material that is hard to be cured by the irradiation of, for example, the ultraviolet rays.

When irradiating the electron beams, the electron beam irradiation tube 11a is moved along above the on-rotating irradiation target object 2, and hence the single electron beam irradiation tube 11a can irradiate substantially the entire surface of the irradiation target object 2 with the electron beams. The apparatus can be constructed of a less number of electron beam irradiation tubes 11a than by the prior art, whereby the number of electron beam irradiation tubes 11a can be reduced. Accordingly, there suffices one single electron beam irradiation tube 11a that is expensive, and therefore the equipment cost can be restrained by increasing neither a weight nor a size of the apparatus. At the same time, the running cost can be restrained without increasing amounts of consumption of $N_2$ gas for cooling and of the electric power.

Further, the surface of the irradiation target object 2 is irradiated with the electron beams of which the acceleration voltage is as low as 20 kV through 100 kV, whereby the electron beam energy can be highly efficiently applied across the object surface over a thin range, e.g., over the lubricating layer. It is therefore possible to prevent deterioration of a substrate, etc. without exerting influence of the electron beams upon the substrate, etc. existing thereunder.

Moreover, the irradiation of the electron beams is conducted after reducing the oxygen concentration in the interior of the shield container 10 down to the predetermined level, so that an inhibition of radical reaction caused by oxygen in the vicinity of the surface of the irradiation target object 2 irradiated with the electron beams is hard to occur, thereby making it possible to ensure preferable hardening reaction in the lubricating layer, etc.

Note that in the discussion given above, the electron beam irradiation tube 11a is moved toward the inner periphery from the outer periphery of the irradiation target object 2 and may also be moved toward the outer periphery from the inner periphery of the irradiation target object 2. Moreover, the electron beam irradiation tube 11a may also be reciprocated such as the outer periphery→the inner periphery→the output periphery of the irradiation target object 2 or the inner periphery→the outer periphery→the inner periphery thereof.

Next, an apparatus for manufacturing the disc-shaped medium according to a second embodiment will be described. FIGS. 6 through 10 are side views of the manufacturing apparatus, explaining respective processes for forming a layer (a lubricating layer) exhibiting lubricity on the disc-shaped medium according to the second embodiment.

As shown in FIGS. 6 through 10, a disc-shaped medium manufacturing apparatus (which will hereinafter be simply termed a [manufacturing apparatus]) 50 has an airtight closable chamber 51 accommodating the electron beam irradiation apparatus 1 that emits the electron beams of which the acceleration voltage is as low as 20 kV through 100 kV and irradiates the surface of a disc-shaped medium 49 with the electron beams, an exchange chamber 52 for loading the pre-irradiation disc-shaped medium 49 into the electron beam irradiation apparatus 1 and receiving a post-irradiation disc-shaped medium 49a from the electron beam irradiation apparatus 1, and a rotational (turn) unit 54 that rotates about a rotary shaft 53 in order to exchange the pre-irradiation disc-shaped medium with the post-irradiation disc-shaped medium.

As shown in FIGS. 6 through 10, the manufacturing apparatus 50 further includes a disc carrying device 60 for carrying the disc-shaped medium in a way that loads the pre-irradiation disc-shaped medium into the exchange chamber 52 and ejects the post-irradiation disc-shaped medium.

Figure 6:
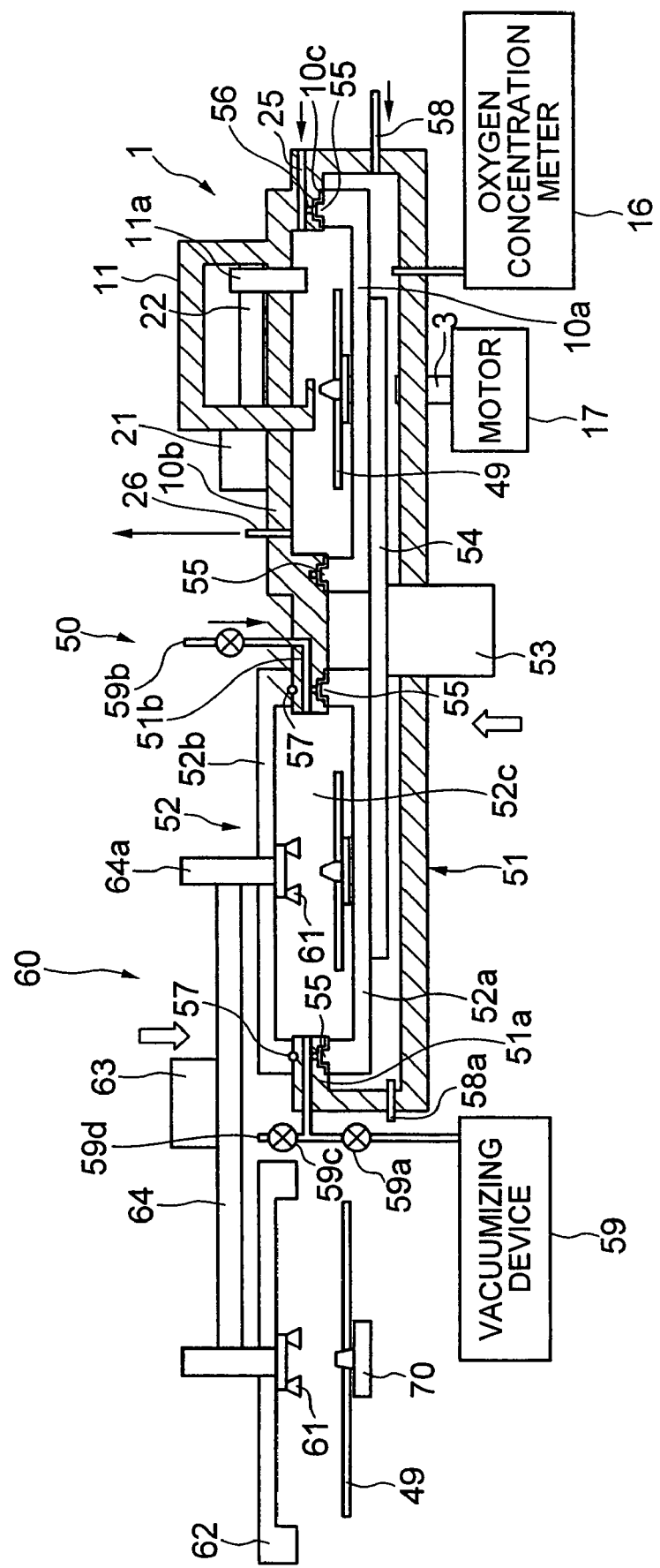
FIG. 6 is an explanatory side sectional view schematically showing an apparatus for manufacturing a disc-shaped medium according to a second embodiment, and showing a process just after the irradiation of the electron beams.

The electron irradiation apparatus 1 is constructed substantially in the same way as in FIGS. 1 through 3, and hence a different point from the configuration in FIGS. 1 through 3 will be explained. To be specific, FIG. 6 shows a variation of the shield container 10 in FIG. 1, wherein this shield container 10 is divided into a rotational (turn) tray unit 10a, provided on a lower side as viewed in FIG. 6, that is configured in a tray-like shape so as to rotatably accommodate the disc-shaped medium 49, and an upper-side fixed unit 10b provided with an irradiation tube container 11b, a moving mechanism 20, etc. The rotational tray unit 10a serving as a first rotational unit is movable to the side f the exchange chamber 52 in a way that moves up and down and turns with the aid of the rotational unit 54 with respect to the fixed unit 10b.

Figure 11:
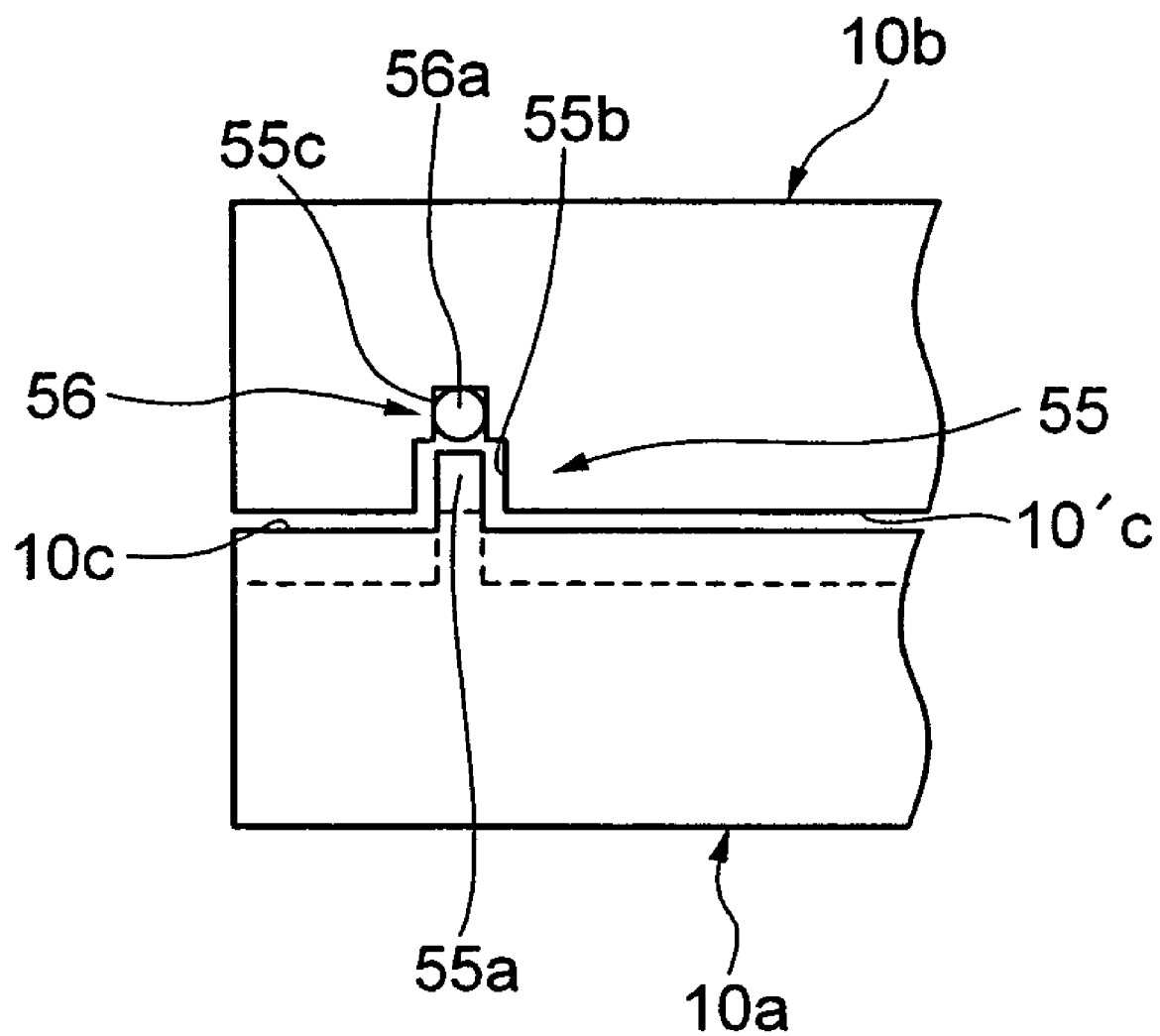
FIG. 11 is an enlarged sectional view showing a shield member 5 in the manufacturing apparatus in FIGS. 5 through 9.

As illustrated in FIG. 6, an abutting face 10c of the rotational tray unit 10a and an abutting face 10c' of the fixed unit 10b are provided with shield members 55 for shielding the electron beams so that the electron beams do not leak out. FIG. 11 is an enlarged sectional view showing the shield member 55. As shown in FIG. 11, the abutting face 10c of the rotational tray unit 10a has a protruded portion 55a formed along the entire periphery thereof, and the abutting face 10c' of the fixed unit 10b has a recessed portion 55b formed along the entire periphery thereof, wherein the protruded portion 55a can be fitted in the recessed portion 55b.

Figure 10:
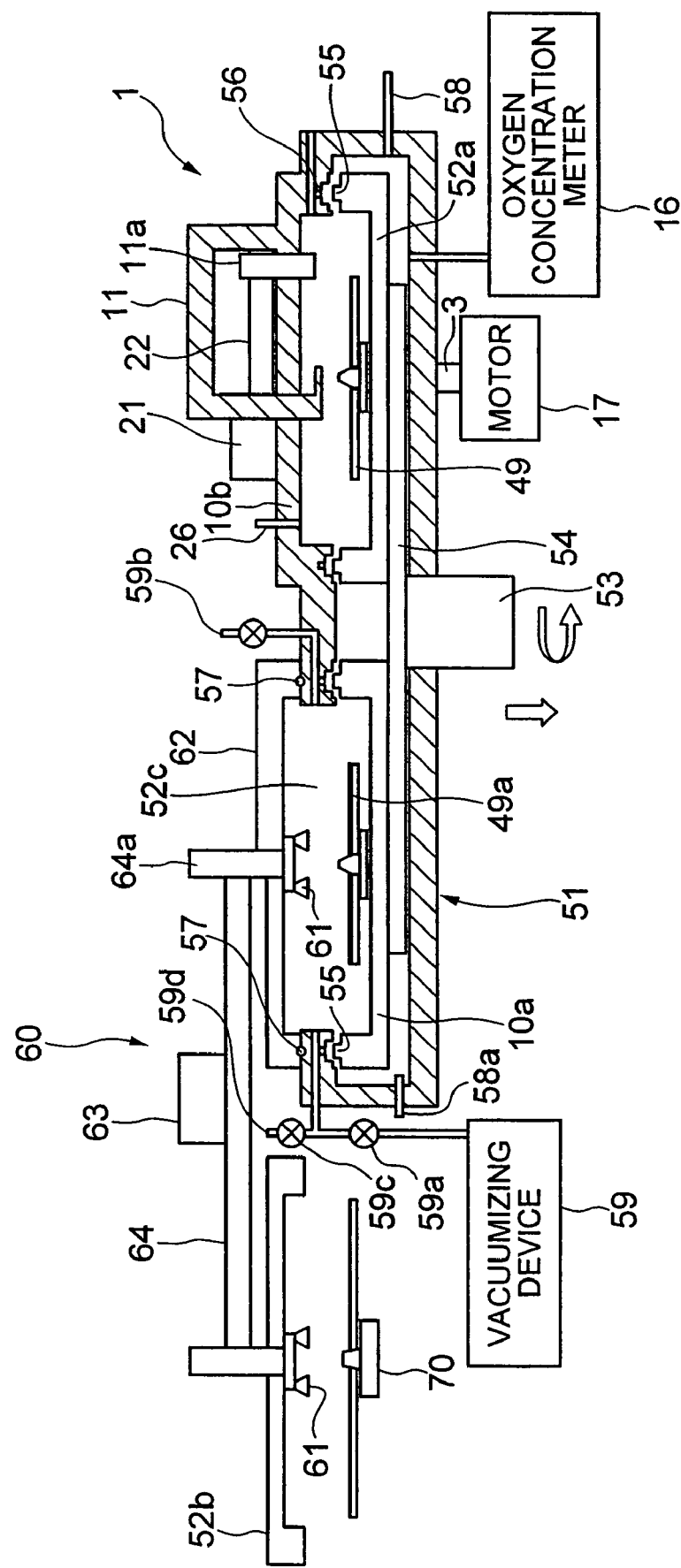
FIG. 10 is an explanatory side sectional view showing the internal exchange process of the disc-shaped medium.

Further, a bottom of the recessed portion 55b configuring the shield member 55 is further formed with a cavity 55c, and an O-ring 56a is accommodated in the cavity 55c, thus forming an airtight closed portion 56. When the abutting face 10c and the abutting face 10c' abut on each other, the protruded portion 55a slightly enters the cavity 55c from through the recessed portion 55b and presses the O-ring 56a in the cavity 55c in the airtight closed portion 56. Thus, the rotational tray unit 10a abuts on the fixed unit 10b, thereby making it possible to enhance airtightness in an airtight closed space 10d formed inside owing to the airtight closed portion 56 and to provide preferable shield property of the electron beams. Note that the rotational tray unit 10a (52a) is, when moved downward for exchanging as shown in FIG. 10, descended down to a position in FIG. 11 so as not to butt against the fixed unit 10b.

Further, in the shield portion 55 in FIG. 11, the O-ring 56a in the airtight closed portion 56 is positioned much closer to the bottom within the cavity 55c from the recessed portion 55b and is not therefore irradiated with the electron beams directly, whereby the O-ring 56a can be prevented from being deteriorated.

As illustrated in FIG. 6, the exchange chamber 52 includes a rotational tray unit 52a serving as a second rotational unit that is moved up and down and rotated by the rotational unit 54 and is thus moved to the side of the electron beam irradiation apparatus 1, wherein this rotational tray unit 52a is exchangeable with the rotational tray unit 10a and configured in the tray shape. The exchange chamber 52 further includes a carry rotational tray unit 52b that receives the pre-irradiation disc-shaped medium and ejects the post-irradiation disc-shaped medium to the outside by use of the disc carrying device 60.

The chamber 51 has an edge portion 51a and a connecting portion 51b that configure part of the exchange chamber 52. The edge portion 51a and the connecting portion 51b are interposed serving as abutting faces between the rotational tray unit 52a and the carry rotational tray unit 52b of the exchange chamber 52, whereby an airtight closed space 52c is formed within the exchange chamber 52 and at the same time the carry rotational tray unit 52b configures part of the chamber 51.

Moreover, airtight closed portions 57 each using an O-ring are provided on an abutting face between the edge portion 51a and the carry rotational tray unit 52b and on an abutting face between the connecting portion 51b and the carry rotational tray unit 52b. Further, the same shield portions 55 and the same airtight closed portions 56 as those in FIG. 10 are respectively provided on the abutting face between the edge portion 51a and the rotational tray unit 52a and on the abutting face between the connecting portion 51b and the rotational tray unit 52a.

The chamber 51 connects to the fixed unit 10b on the side of the edge portion of the electron beam irradiation apparatus 1, the connecting portion 51b connects to the fixed unit 10b in the vicinity of a central portion, and the carry rotational tray unit 52b is air-tightly closed by the edge portion 51a and by the connecting portion 51b, thereby becoming air-tightly closable on the whole. Moreover, the chamber 51, the carry rotational tray unit 52b (62), the rotational tray unit 10a, the fixed unit 10b, etc., are made of iron and steel, stainless steel and so on, thereby shielding the electron beams to prevent the electron beams from leaking to the outside.

The nitrogen gas can be introduced into the chamber 51 via a nitrogen gas introduction port 58, and the airtight closed space 52c within the exchange chamber 52 can be depressurized by a vacuumizing device 59. As shown in FIG. 10, in a state where the whole chamber 51 is air-tightly closed, the rotational unit 54 moves together with the rotational tray units 10a, 50a downward as viewed in FIG. 10, and the airtight closed spaces 10d, 52c are opened. This case indicates a state in which the interior of exchange chamber is replaced with the nitrogen gas, and hence the interior of the chamber 51 does not affect the nitrogen gas atmosphere in the airtight closed space 10d of the electron beam irradiation apparatus 1.

Moreover, the nitrogen gas can be introduced into the exchange chamber 52 via a nitrogen gas introduction port 59b. Further, the nitrogen gas in the chamber 51 can be discharged from a gas discharge port 58a.

As shown in FIG. 6, the disc carrying device 60 includes another carry rotational tray unit 62 exchangeable with the carry rotational tray unit 52b configuring the exchange chamber 52, and a rotational unit (rotational plate) 64 that rotates the carry rotational tray units 52b, 62 through a rotary shaft 63. Each of the carry rotational tray units 52b, 62 has an adsorbing member 61 for vacuum-adsorbing the disc-shaped medium 49 in the vicinity of the periphery of a central hole of the disc-shaped medium 49. The rotational unit 64 makes the up-and-down and rotational movements and thus carries the disc-shaped medium between the exchange chamber 52 and an external disc transferring/receiving unit 70.

The disc-shaped medium 49 supplied from the disc transferring/receiving unit 70 to the exchange chamber 52 is formed on its surface with a light transmitting layer containing a resinous material and a lubricating layer composed of a lubricant thereon by use of an external spin coat device.

A material for forming this type of light transmitting layer is not particularly limited on condition that it is an active energy ray curing compound. It is, however, preferable that this material contains at least one reactive group selected from within a (meta) acryloyl group, a vinyl group and a mercapto group. For others, the aforementioned material may contain a known photo-polymerization initiator.

Further, for example, a silicon compound and a fluorine compound each exhibiting radical polymerization property are given as materials for forming the lubricating layer. The materials are not, however, limited to those aforementioned. Those lubricating layer forming materials are generally hard to be cured by ultraviolet rays in the case of containing no photo-polymerization initiator but can be instantaneously cured by the electron beams.

Next, an operation of the manufacturing apparatus 50 described above will be explained with reference to flow-charts in FIGS. 6 through 10 and 12 in a way that divides the operation into the irradiation of the electron beams upon the disc-shaped medium and the ejecting/supplying of the disc-shaped medium.

Figure 12:
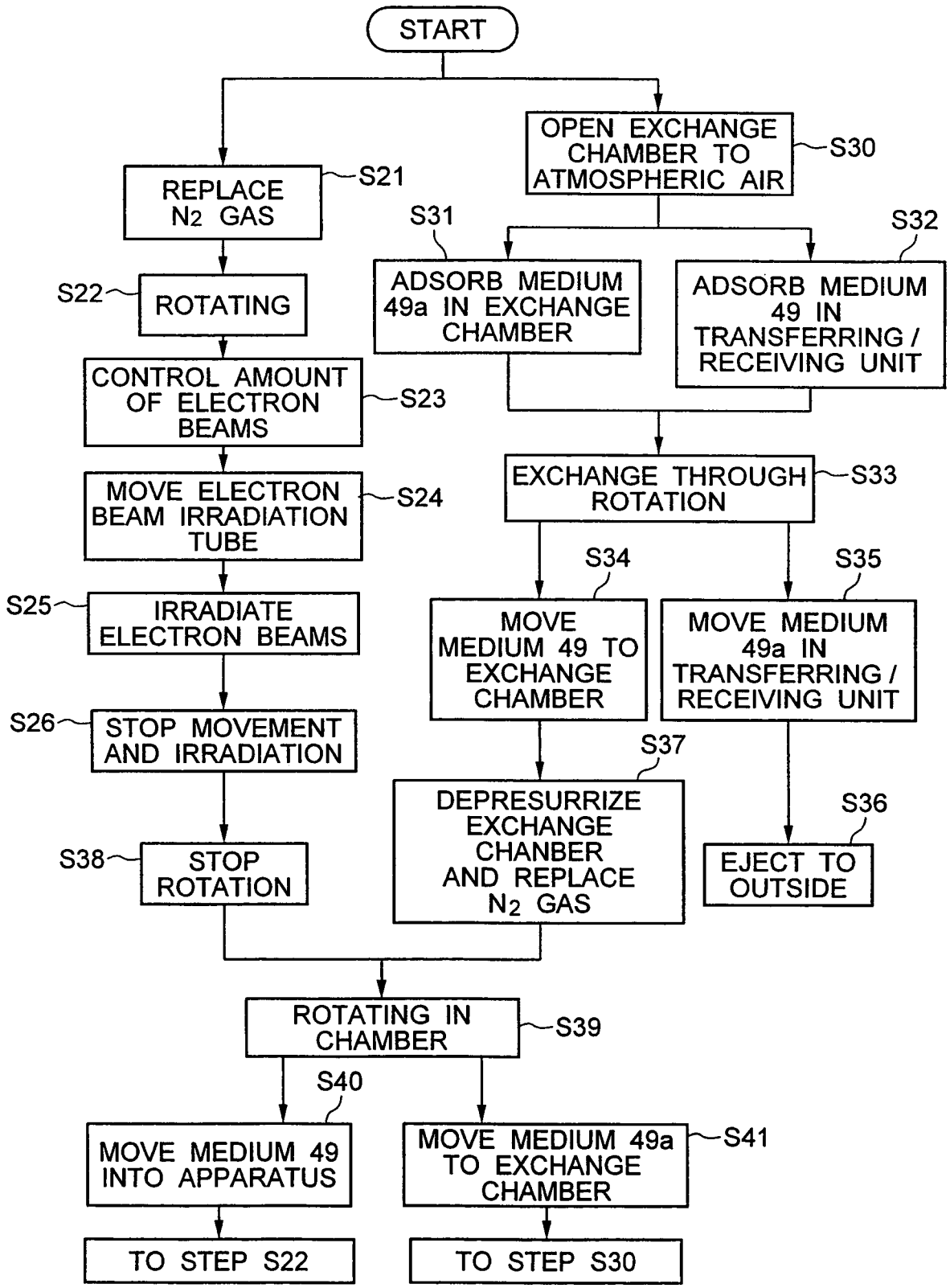
FIG. 12 is a flowchart showing respective steps of irradiating the disc-shaped medium with the electron beams and respective steps of ejecting and supplying the disc-shaped medium in the manufacturing apparatus in FIGS. 5 through 9.

As shown in FIG. 12, to begin with, the whole chamber 51 is air-tightly closed as illustrated in FIG. 10, and the rotary shaft 53 and the rotational unit 54 moves downward as viewed in FIG. 10 together with the rotational tray units 10a, 52a. Then, after the airtight closed spaces 10d, 52c have been opened, the nitrogen gas is introduced into the chamber 51 via the nitrogen gas introduction port 58, thereby replacing the interior thereof with the nitrogen gas atmosphere (S21). At this time, the replacement with the nitrogen gas can be performed while measuring a concentration of oxygen in the chamber 51 by the oxygen concentration meter 16.

Next, when the rotary shaft 53 and the rotational unit 54 move upward as viewed in the Figure together with the rotational tray units 10a, 52a, as shown in FIG. 6, the airtight closed spaces 10d, 52c are formed. Then, in the electron beam irradiation apparatus 1, the disc-shaped medium 49 is rotated by the motor 17 within the airtight closed space 10d (S22), the electron beam irradiation tube 11a is controlled to emit a predetermined amount of electron beams (S23), and the nitrogen gas flows through the vicinity of the irradiation window 11c toward the gas discharge port 26 from the gas introduction port 25.

Next, the electron beam irradiation tube 11a starts moving by operating the moving mechanism 20 and is moved toward the inner periphery from the outer periphery of the disc-shaped medium 49 (S24), and simultaneously the surface, formed with the lubricating layer on the light transmitting layer, of the on-rotating disc-shaped medium 49 is irradiated with the electron beams (S25).

At this time, the electron beam irradiation tube 11a is moved in a way that changes the moving velocity of the movement in the radial direction R (FIGS. 2 and 17) to a high velocity from a low velocity as the electron beam irradiation tube 11a moves from the outermost periphery to the innermost periphery of the disc-shaped medium 49 as shown in FIG. 5, then substantially the entire surface of the disc-shaped medium 49 is irradiated with the electron beams, and thereafter the movement and the irradiation of the electron beam irradiation tube 11a are stopped (S26). This enables acquisition of the disc-shaped medium 49a including the lubricating layer fixed onto the surface of the light transmitting layer of the disc-shaped medium 49. This is considered such that the vicinity of the surface of the light transmitting layer is cured, and at the same time the reactive group of the lubricant is bound (cured) with reactive groups of the surface of the light transmitting layer and of other lubricant.

Figure 7:
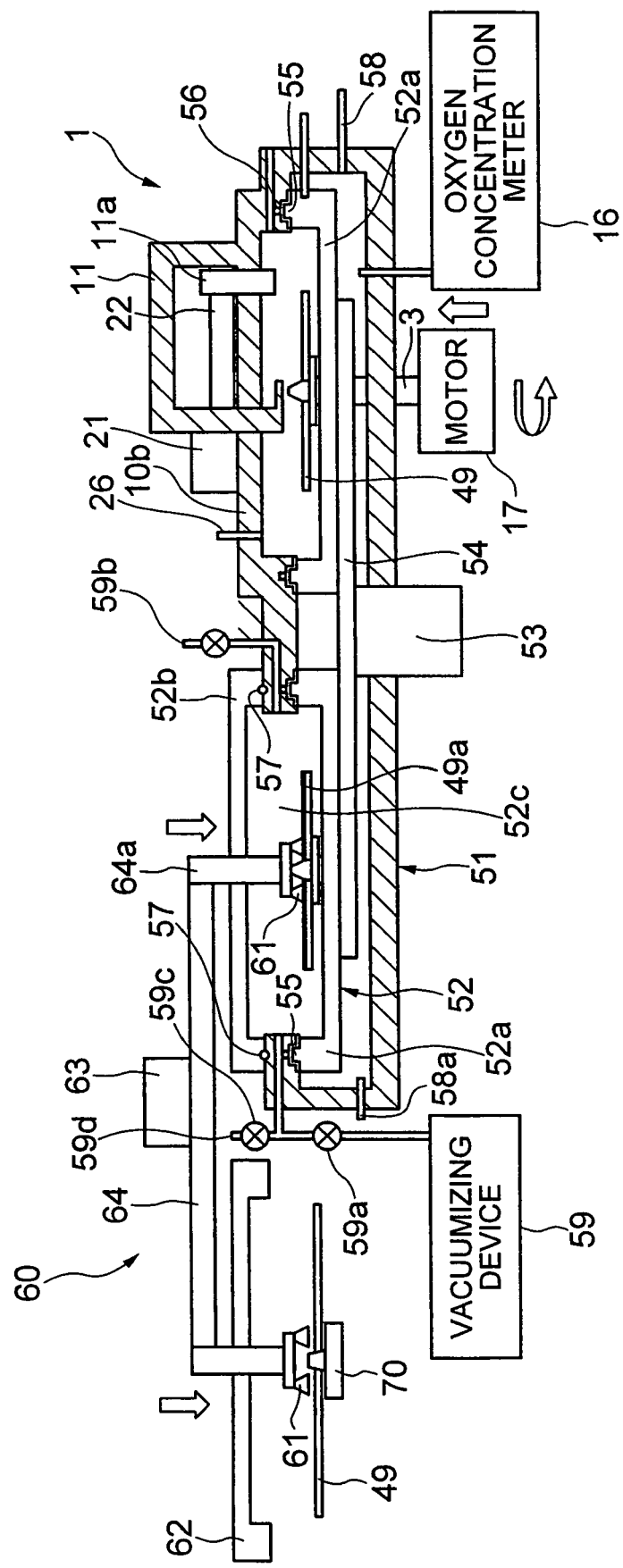
FIG. 7 is an explanatory side sectional view showing the irradiation of the electron beams on the disc-shaped medium, and showing a process of exchanging the disc-shaped medium with an external disc-shaped medium.

In a state where the airtight closed space 52c is formed within the exchange chamber 52 as shown in FIG. 6, the airtight closed space 52c in the exchange chamber 52 accommodating the post-irradiation disc-shaped medium 49a inside is opened to the atmospheric air through an opening valve 59c and an opening port 59d as shown in FIG. 7 (S30).

Then, the disc carrying device 60 moves the adsorbing member 61 provided on the side of the carry rotational tray unit 52b downward as viewed in FIG. 7 by lowering the rotary shaft 63 and an adsorbing arm 64a of the rotational unit 64, whereby the adsorbing member 61 adsorbs the disc-shaped medium 49a (S31). Almost simultaneously with this, the adsorbing member 61 on the side of another carry rotational tray unit 62 adsorbs the pre-irradiation disc-shaped medium 49 formed with the lubricating layer on its surface, which is accommodated in the external disc transferring/receiving unit 70 (S32).

Figure 8:
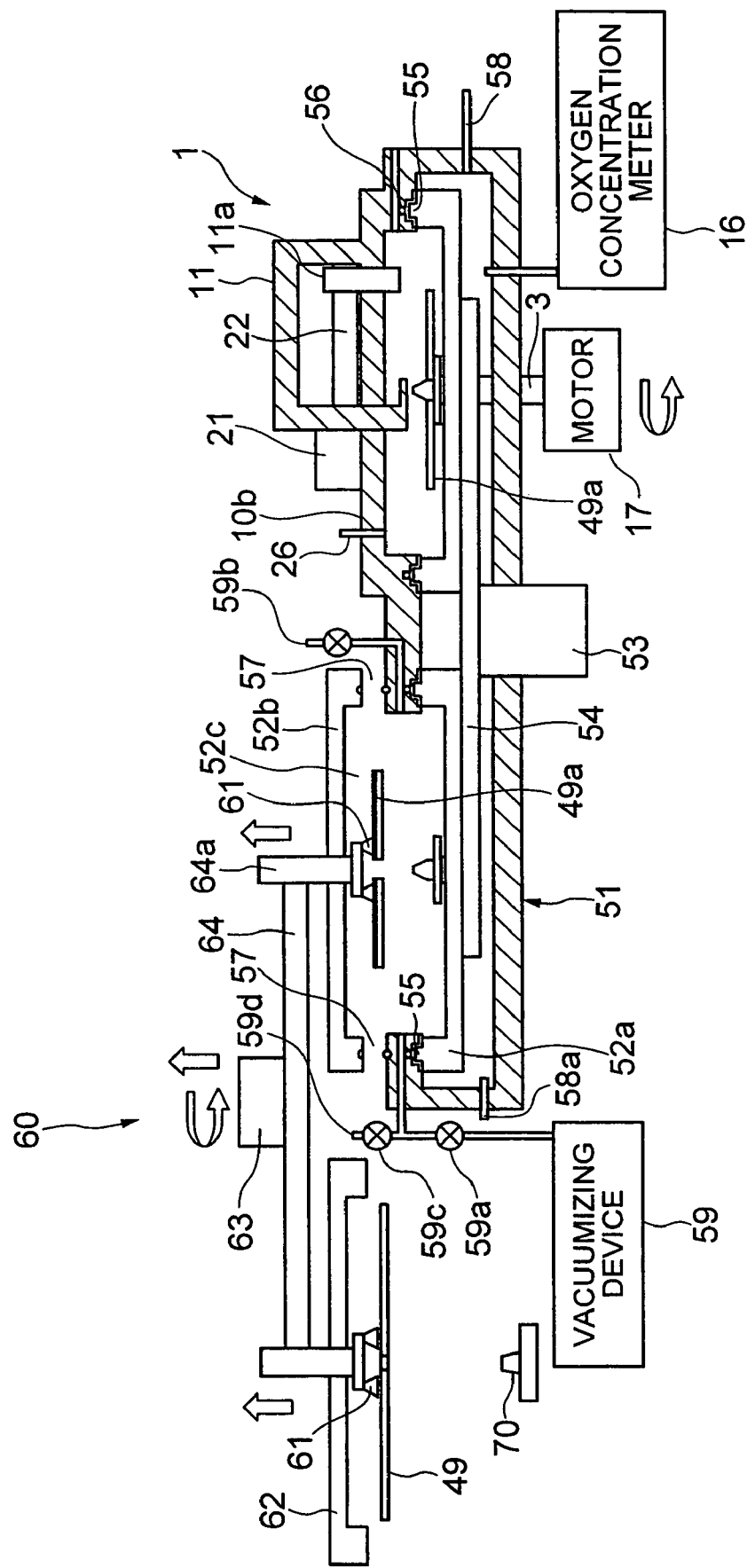
FIG. 8 is an explanatory side sectional view showing the irradiation of the electron beams on the disc-shaped medium, and showing the process of exchanging the disc-shaped medium with the external disc-shaped medium.

Next, as illustrated in FIG. 8, the disc carrying device 60 raises the disc-shaped medium 49a by lifting up the adsorbing arm 64a, and simultaneously moves the rotary shaft 63 and the rotational unit 64 upward as viewed in FIG. 8. Then, the rotational unit 64 rotates about the rotary shaft 63, whereby the carry rotational tray units 52b and 62 are replaced in their positions with each other (S33).

Figure 9:
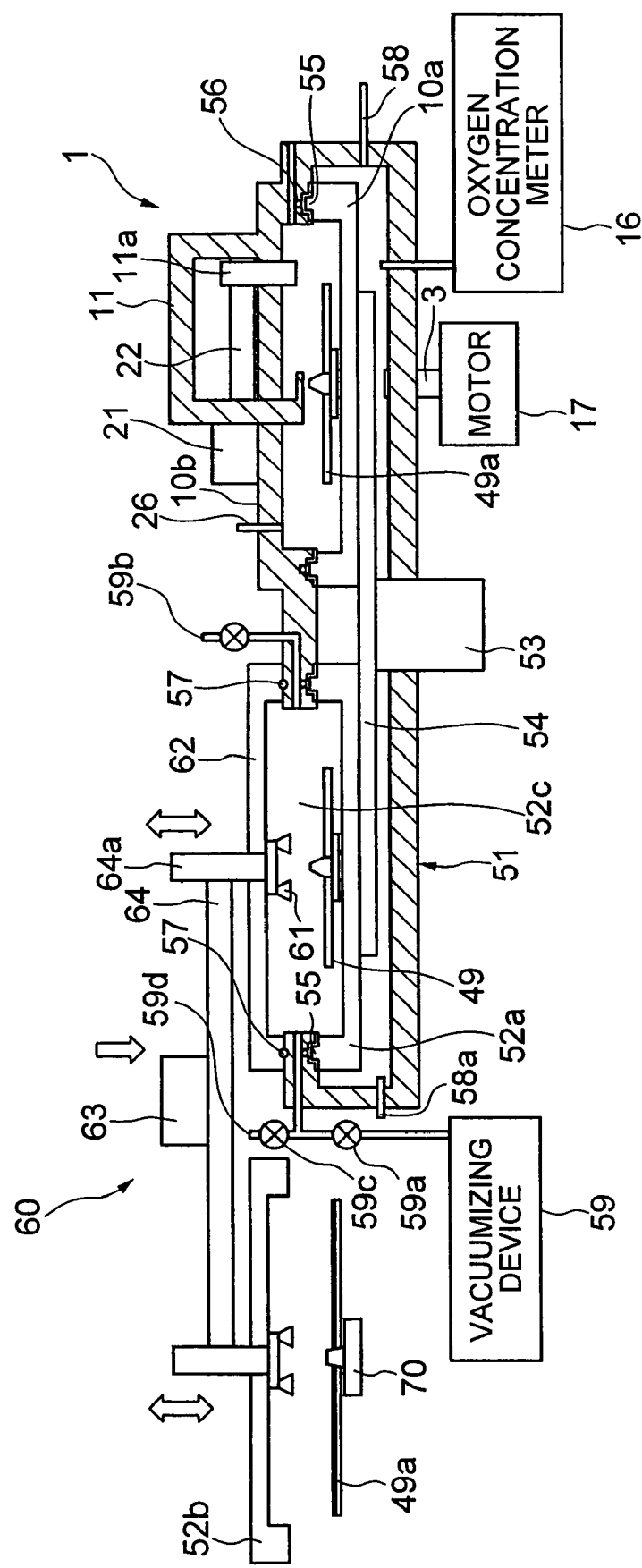
FIG. 9 is an explanatory side sectional view showing preparatory processes in an internal exchange process of the disc-shaped medium.

Next, as shown in FIG. 9, the disc carrying device 60 moves the rotary shaft 63 and the rotational unit 64 downward as viewed in FIG. 8, thereby setting the disc-shaped medium 49a into the rotational tray unit 52a of the exchange chamber 52 (S34). On the other hand, the disc-shaped medium 49a is transferred to the disc transferring/receiving unit 70 (S35), and the respective adsorbing members 61 stop adsorbing the disc-shaped mediums 49, 49a and move upward as viewed in FIG. 9. The disc-shaped medium 49a is ejected to the outside from the disc transferring/receiving unit 70 (S36).

Then, the airtight closed space 52c, which is formed again in the manner described above, within the exchange chamber 52 is depressurized by the vacuumizing device 59, and the nitrogen gas is introduced via the nitrogen gas introduction port 59*b*, wherein the replacement of the nitrogen gas is conducted beforehand (S37).

In the way described above, the disc-shaped medium 49*a* after being irradiated with the electron beams can be carried up to the disc transferring/receiving unit 70 from the exchange chamber 52, and the same time the disc-shaped medium 49 before being irradiated with the electron beams can be carried up to the exchange chamber 52 from the disc transferring/receiving unit 70. Thus, the disc-shaped mediums 49, 49*a* can be exchanged by the single rotational operation of each of the rotary shaft 63 and the rotational unit 64.

Further, the exchange between the disc-shaped mediums 49, 49*a* can be efficiently executed during the irradiation of the electron beams by the electron beam irradiation apparatus 1 because of the airtight closed spaces 10*d*, 52*c* being independent of each other as shown in FIGS. 7 and 8.

Next, an exchanging operation of the disc-shaped medium between the exchange chamber 52 and the electron beam irradiation apparatus 1 will be explained. To be specific, as illustrated in FIG. 9, the rotational tray unit 52*a* of the exchange chamber 52 accommodates the pre-irradiation disc-shaped medium 49. In the electron beam irradiation apparatus 1, the rotation by the motor 17 is stopped (S38), the disc-shaped medium 49*a* that has finished being irradiated with the electron beams is housed in the rotational tray unit 10*a*, and, in this state, the rotary shaft 53 and the rotational unit 54 move downward as viewed in FIG. 9, whereby the rotational tray units 52*a*, 10*a* move downward to open the airtight closed spaces 52*c*, 10*d*. Note that the interior of the airtight closed space 52*c* has been replaced with the nitrogen gas atmosphere at that time, and hence there is no influence on other portions within the chamber 51.

Next, as shown in FIG. 10, the rotational unit 54 rotates about the rotary shaft 53 within the chamber 51, thereby exchanging the rotational tray units 52*a*, 10*a* in their positions with each other (S39). With this operation, the pre-irradiation disc-shaped medium 49 housed in the rotational tray unit 52*a* is moved into the electron beam irradiation apparatus 1 (S40), and, almost simultaneously with this, the disc-shaped medium 49*a* housed in the rotational tray unit 10*a* is moved into the exchange chamber 52 (S41).

In the way explained above, the disc-shaped mediums 49, 49*a* can be exchanged with each other between the exchange chamber 52 and the electron beam irradiation apparatus 1 by performing one rotational operation of each of the rotary shaft 53 and the rotational unit 54. Then, the rotary shaft 53 and the rotational unit 54 move upward as viewed in the Figure in order to move upward the rotational tray units 52*a*, 10*a*, whereby the airtight closed spaces 52*c*, 10*d* are again formed as shown in FIG. 6. Then, in the electron beam irradiation apparatus 1 the operation returns to step S22 described above, and in the exchange chamber 52 the operation goes back to step S30, thus enabling the same operations to be repeated. Note that the rotary shaft 3 of the motor 17 is contrived to, when the rotary shaft 53 and the rotational unit 54 rotate, retreat downward from the rotational unit 54 and from the rotational tray unit 10*a*, thus permitting the rotational unit 54 to rotate.

As explained above, according to the manufacturing apparatus 50 in FIGS. 5 through 9, the disc-shaped medium 49 of which the surface is formed with the lubricating layer, etc. is rotated, and the on-rotating disc-shaped medium is irradiated with the electron beams whose acceleration voltage is as low as 20 kV through 100 kV. It is therefore possible to irradiate instantaneously the disc-shaped medium at a high efficiency with the electron beams exhibiting the greater energy than the ultraviolet rays have. This enables both of facilitation of curing and fixing the lubricating layer, etc. that is hard to be cured by the irradiation of the ultraviolet rays and the instantaneous formation of the lubricating layer, etc. As a result of improving the productivity for forming the lubricating layer, etc., this improvement can contribute to enhance the productivity of the disc-shaped medium.

Moreover, the single electron beam irradiation tube 11*a* is capable of irradiating the electron beams substantially over the entire surface of the disc-shaped medium 49, and consequently the number of electron beam irradiation tubes can be reduced. There suffices one single electron beam irradiation tube that is expensive, and therefore the equipment cost can be restrained by increasing neither the weight nor the size of the apparatus. At the same time, the running cost can be restrained without increasing amounts of consumption of $N_2$ gas for cooling and of the electric power, and the cost for manufacturing the disc-shaped medium 49 can be decreased.

Further, the electron beam irradiation tube 11*a* is moved in a way that changes the moving velocity thereof to the high velocity from the low velocity as the electron beam irradiation tube 11*a* moves from the outermost periphery to the innermost periphery of the disc-shaped medium 49, thereby irradiating substantially the entire surface of the disc-shaped medium 49 with the electron beams. It is therefore feasible to keep constant the electron beam absorbed dose of the disc-shaped medium 49 irrespective of the radius-directional position of the disc-shaped medium 49 and also to easily uniformly cure the lubricating layer, etc.

Still further, in the interior of the chamber 51 and in the disc carrying device 60, the two pieces of rotational tray units are exchanged with each other by the single rotational operation of each rotational tray unit in synchronization between one rotational tray unit and the other rotational tray unit, thereby ejecting the post-irradiation disc-shaped medium 49*a* and supplying the pre-irradiation disc-shaped medium 49. The disc-shaped mediums 49, 49*a* can be thus efficiently exchanged with each other, and hence the productivity is improved.

Yet further, because of using the electron beams of which the acceleration voltage is as low as 20 Kv through 100 kV, the electron beam energy is efficiently applied to the lubricating layer, etc. existing over the thin range from the surface, and the electron beams do not affect the substrate existing thereunder.

Figure 13:
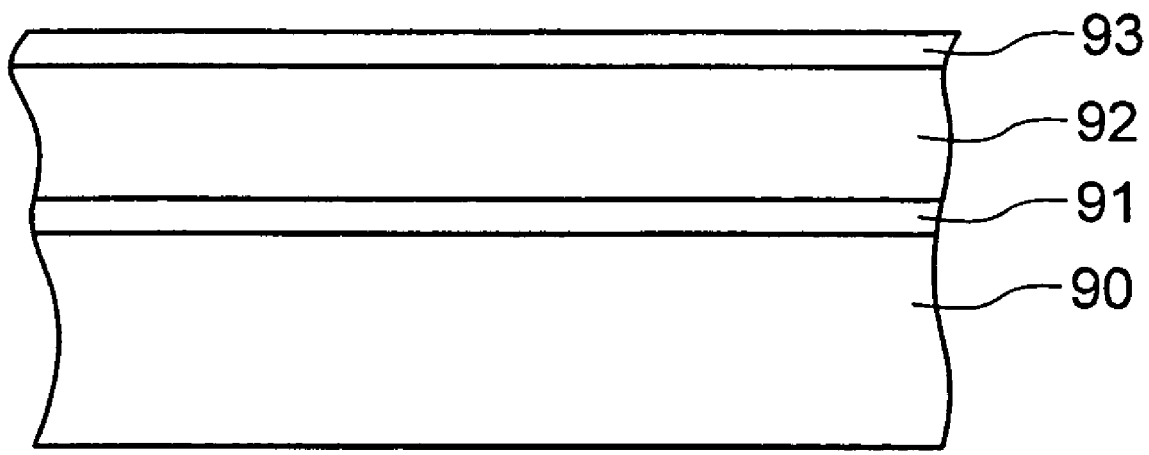
FIG. 13 is a view showing an example of a layer structure of an optical disc that can be manufactured by the manufacturing apparatus in FIGS. 6 through 10.

For example, the electron beam irradiation tube 11*a*, configuring the electron beam irradiation unit 11 of the electron beam irradiation apparatus 1, for irradiating the electron beams having the low acceleration voltage, is available on the market as offered by Ushio Electric Co., Ltd. The electron beam irradiation tube 11*a* is capable of efficiently applying the electron beam energy to the lubricating layer/resin layer, etc. within a depthwise range that is on the order of 10 μm through 20 μm from the surface under the condition that the acceleration voltage is 50 kV, and a tube current is 0.6 mA per piece, and is capable of efficiently curing the layer instantaneously in less than 1 sec. For instance, the electron beam irradiation tube 11*a* can simultaneously cure not only a lubricating layer 93 on the optical disc as shown in FIG. 13 but also even a portion, contiguous to the lubricating layer 93, of a light transmitting layer 92. Besides, for example, since the electron beams do not reach a substrate 90 existing under the lubricating layer 93 on the optical disc as illustrated in FIG. 13, and hence no damage is exerted on the substrate 90 composed of a resin material such as polycarbonate, etc., and there occurs none of adverse influence such as discoloration, deformation, deterioration and so forth.

Note that a silicon thin film having a thickness of approximately 3 μm is preferable for a window material that composes the irradiation window 11c of the electron beam irradiation tube 11a, wherein the electron beams accelerated by a voltage equal to or lower than 100 kV, which can not be captured (taken out) by the conventional irradiation window, can be captured by the irradiation window 11c.

The disc-shaped medium manufacturing apparatus will be described by way of a third embodiment. The disc-shaped medium manufacturing apparatus in FIGS. 6 through 11 according to the second embodiment discussed above is constructed to irradiate the electron beams while moving the single electron beam irradiation tube with respect to the disc-shaped medium. A construction in the third embodiment is, however, such that the disc-shaped medium is moved close to and away from the single electron beam irradiation tube. The discussion is therefore concentrated on different portions from the second embodiment, wherein the same components as those in the second embodiment are marked with the same numerals and symbols, and their explanations are omitted.

Figure 14:
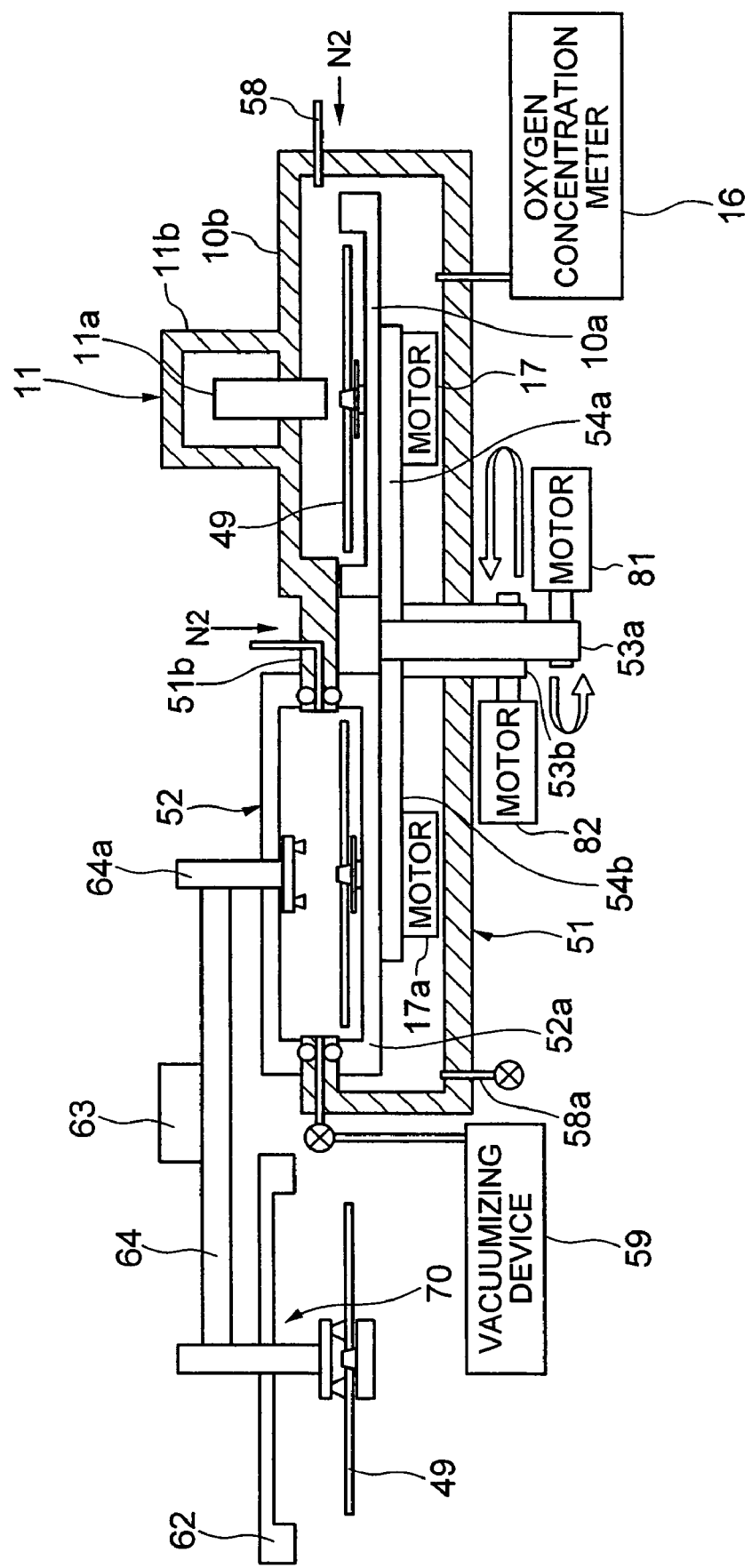
FIG. 14 a side view, showing a process similar to that in FIG. 6, of the manufacturing apparatus for forming the lubricating layer, etc. on the disc-shaped medium in a third embodiment.
Figure 15:
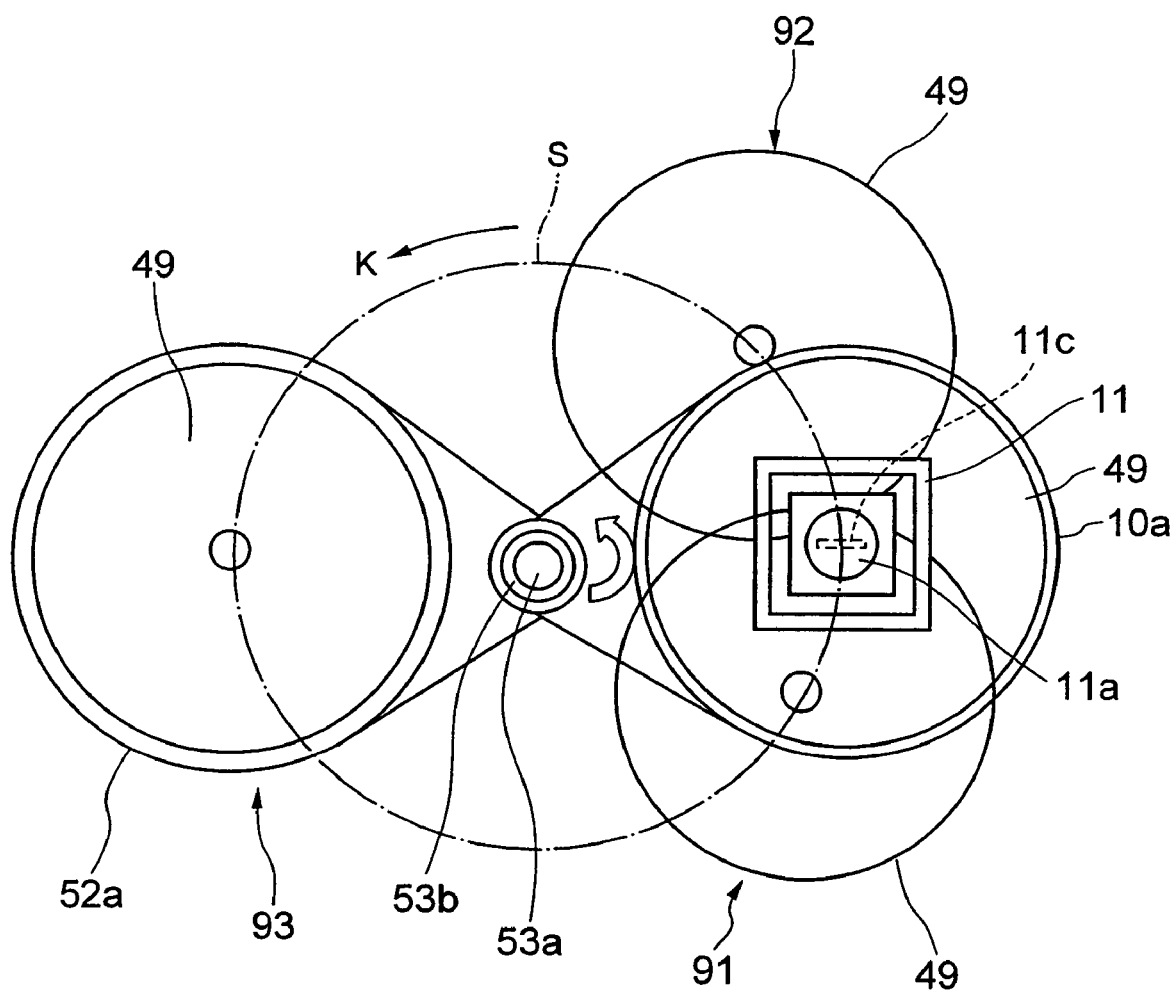
FIG. 15 is a plan view of the principal portions of the manufacturing apparatus in FIG. 14.
Figure 16:
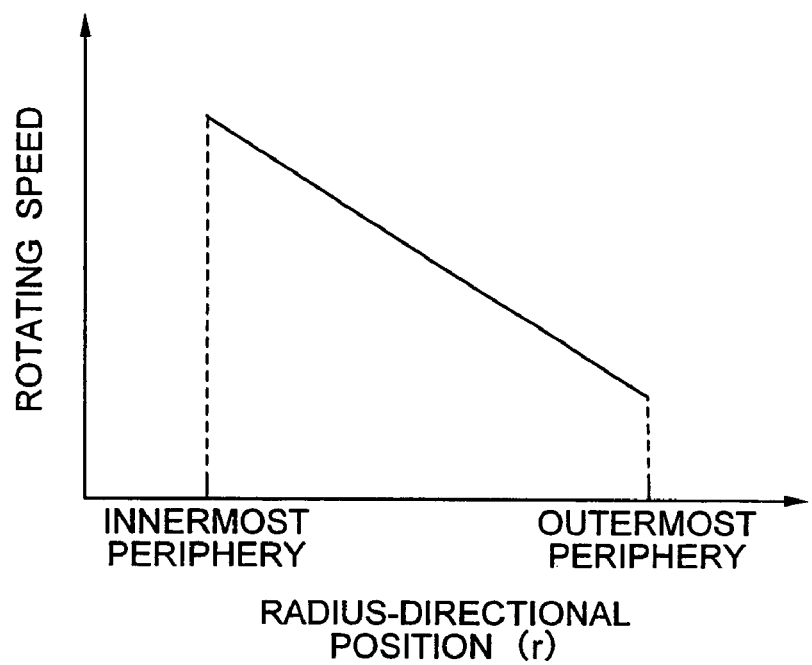
FIG. 16 is a diagram schematically showing a relation between a radius-directional position of the electron beam irradiation tube 11 with respect to the disc-shaped medium and a rotating speed of the disc-shaped medium in FIGS. 14 and 15.

FIG. 14 is a side view showing the same processes, as those in FIG. 6, of the manufacturing apparatus, for forming the lubricating layer, etc. on the disc-shaped medium in the third embodiment. FIG. 15 is a plan view of principal portions of the manufacturing apparatus in FIG. 14. FIG. 16 is a diagram schematically showing a relation between a radius-directional position of the electron beam irradiation tube 11a in FIGS. 11 and 15 with respect to the disc-shaped medium and a rotating speed of the disc-shaped medium.

As shown in FIG. 14, in the manufacturing apparatus according to the third embodiment, the electron beam irradiation unit 11 includes the electron beam irradiation tube 11a fixedly disposed in an upper position in the vicinity of the center of the disc-shaped medium 49 within the irradiation tube container 11b.

Further, the rotational tray unit 52a and the rotational tray unit 10b are independently rotationally controlled in order to exchange the rotational tray units 52a, 10a in their positions within the chamber 51. The rotational tray unit 52a is rotated (auto-rotation) by a motor 17a different from the motor 17 for the rotational tray unit 10a.

Moreover, the rotational tray unit 10a is revolved through a rotary shaft 53a by a motor 81. The rotational tray unit 52a is revolved by a motor 82 through a rotary shaft 53b disposed concentrically with the rotary shaft 53a.

As shown in FIGS. 14 and 15, the rotational tray unit 10a is, when the disc-shaped medium 49 is irradiated with the electron beams from the electron beam irradiation tube 11a, controlled so that the disc-shaped medium 49 is, while being rotated by the motor 17, moved by the motor 81 from an electron beam irradiation start position 91 up to an electron beam irradiation end position 92 along a revolution trajectory S (indicated by a one-dotted chain line in FIG. 15) taking a circular shape in a revolving direction k about the rotary shaft 53a at a fixed revolution speed.

Further, the rotational tray unit 52a located in an exchange position 93 in FIG. 15 is likewise so controlled as to be moved in the revolving direction k along the revolution trajectory S in order to be exchanged with the rotational tray unit 10a, and then moved to the electron beam irradiation start position 91 in FIG. 15, wherein next other disc-shaped medium held by the rotational tray unit 52a is to be irradiated with the electron beams.

As shown in FIG. 16, when the electron beam irradiation tube 11a irradiates the electron beams over the inner peripheral side of the disc-shaped medium 49 in the electron beam irradiation start position 91 in FIG. 15, the rotating speed of the disc-shaped medium 49 by the motor 17 is increased, the disc-shaped medium 49 is moved while revolving toward the electron beam irradiation end position 92 in FIG. 15, and the electron beam irradiation tube 11a irradiates the electron beams over the outer peripheral side of the medium 49. At this time, the electron beam absorbed dose of the disc-shaped medium 49 can be set fixed irrespective of the radius-directional position of the disc-shaped medium 49 by controlling the rotating speed of the motor 17 so that the rotating speed of the disc-shaped medium 49 gradually decreases.

As discussed above, in the case of performing a relative movement between the electron beam irradiation tube 11a and the disc-shaped medium 49 by making the revolving movement of the disc-shaped medium 49, a rotating speed (speed of rotation) t of the disc-shaped medium 49 and a radius-directional position r of the electron beam irradiation tube 11a from the rotational center, are so controlled as to establish the following relational formula (1).

$$t \propto 1/r \tag{1}$$

According to the manufacturing apparatus in FIGS. 14 through 16, the disc-shaped medium 49 formed with the lubricating layer, etc. on its surface is rotated, this on-rotating disc-shaped medium is irradiated with the electron beams of which the acceleration voltage is as low as 20 kV through 100 kV. It is therefore possible to irradiate instantaneously the disc-shaped medium at the high efficiency with the electron beams exhibiting the greater energy than the ultraviolet rays have. This enables both of facilitation of curing and fixing the lubricating layer, etc. that is hard to be cured by the irradiation of the ultraviolet rays and the instantaneous formation of the lubricating layer, etc. As a result of improving the productivity for forming the lubricating layer, etc., this improvement can contribute to enhance the productivity of the disc-shaped medium.

Moreover, the single electron beam irradiation tube 11a is capable of irradiating the electron beams substantially over the entire surface of the disc-shaped medium 49, and consequently the number of electron beam irradiation tubes can be reduced. There suffices one single electron beam irradiation tube that is expensive, and therefore the equipment cost can be restrained by increasing neither the weight nor the size of the apparatus. At the same time, the running cost can be restrained without increasing amounts of consumption of $N_2$ gas for cooling and of the electric power, and the cost for manufacturing the disc-shaped medium 49 can be decreased.

Further, when the irradiating position of the electron beam irradiation tube 11a shifts from the innermost periphery to the outermost periphery of the disc-shaped medium 49 while the disc-shaped medium 49 revolves as illustrated in FIG. 15, the disc-shaped medium is rotated (auto-rotation) in a way that changes the speed thereof to the low speed from the high speed toward the outermost periphery from the innermost periphery of the disc-shaped medium 49, thereby irradiating substantially the entire surface of the disc-shaped medium 49 with the electron beams. It is therefore feasible to keep constant the electron beam absorbed dose of the disc-shaped medium 49 irrespective of the radius-directional position of the disc-shaped medium 49 and also to easily uniformly cure the lubricating layer, etc.

Still further, similarly in FIGS. 6 through 10, in the interior of the chamber 51 and in the disc carrying device 60, the two pieces of rotational tray units are exchanged with each other by the single rotational operation of each rotational tray unit in synchronization between one rotational tray unit and the other rotational tray unit, thereby enabling the ejection of the post-irradiation disc-shaped medium 49 and the supply of the pre-irradiation disc-shaped medium 49. The disc-shaped mediums 49 can be thus efficiently exchanged with each other, and hence the productivity is improved.

It should be noted that throughout the present specification, the term "rotational" implies not a simple consecutive rotation of the irradiation target object, i.e., the disc-shaped medium in one direction (or in the direction opposite thereto) as in the rotation but a turn in a way that changes its position so as to turn by a predetermined amount in one direction or in the opposite direction and then stop. Further, the term "radial direction" of the disc-shaped medium connotes the directions extending radially from the rotational center of the irradiation target object, i.e., the disc-shaped medium, and includes the directions extending to the outer periphery of the irradiation target object, i.e., the disc-shaped medium from points eccentric from the rotational center of the irradiation target object, i.e., the disc-shaped medium.

As discussed above, the present invention has been described by way of the embodiments but is not limited to those embodiments, and a variety of modifications can be made within the range of the technical ideas of the present invention. For example, in the apparatus for manufacturing the disc-shaped medium according to the present embodiment, the exemplification is that the light transmitting layer and the lubricating layer that are composed of the aforementioned materials are formed by curing in the vicinity of the surface of the disc-shaped medium such as an optical disc, etc., however, the present invention is not limited to this construction and may also be, as a matter of course, applied to the curing of a resin layer, etc. other than the lubricating layer. For instance, the present invention may be applied to forming, in FIG. 13, only the light transmitting layer 92 under the lubricating layer 93, wherein the layer can be instantaneously cured. This is efficient and can contribute to the improvement of the productivity.

Moreover, a variety of disc shapes may be taken for the irradiation target object that can be irradiated with the electron beams by the electron beam irradiation apparatus 1. Further, the disc-shaped medium such as the optical disc, etc. has been exemplified as the disc-shaped object that can be manufactured by the manufacturing apparatus in FIGS. 6 and 14, however, the present invention can be, as a matter of course, applied to a case of forming a variety of resin layers on the disc-shaped object other than the medium.

Still further, the moving velocity of the electron beam irradiation tube 11a by the moving mechanism 20 in FIGS. 1, 2 and 6 through 10 is set fixed, and the rotating speed of the motor 17 is controlled to decrease the rotating speed of the irradiation target object 2 by use of the motor 17 when the electron beam irradiation tube 11a irradiates the electron beams over the outer periphery side of the irradiation target object 2 and to increase the rotating speed of the irradiation target object 2 when irradiating the electron beams over the inner periphery side thereof. Namely, the number of revolutions of the motor 17 is so controlled for establishing the aforementioned relational formula (1) as to gradually decrease from the outermost periphery toward the innermost periphery in accordance with the radius-direction position of the electron beam irradiation tube 11a along the ball side shaft 22, whereby the electron beam absorbed dose of the irradiation target object 2 can be set fixed regardless of the radius-directional position of the irradiation target object 2. Further, both of the moving velocity of the electron beam irradiation tube 11a and the rotating speed of the irradiation target object 2 may also be controlled.

Moreover, in FIGS. 14 and 15, the revolution speed in the revolving direction k along the revolution trajectory S of the disc-shaped medium 49 is set fixed and may also be so controlled as to increase when the irradiation position of the electron beam irradiation tube 11a is on the side of the innermost periphery and to decrease when on the side of the outermost periphery. At this time, the rotating (auto-rotation) speed of the disc-shaped medium 49 can be set fixed and may also be set variable. Through these control operations, the electron beam absorbed dose of the irradiation target object 2 can be set fixed irrespective of the radius-directional position of the irradiation target object 2.

Moreover, in the electron beam irradiation apparatus in FIG. 1 and in the manufacturing apparatus in FIGS. 6 and 14, it is preferable that the tube voltage, etc. of the electron beam irradiation tube be determined in consideration of the layer thickness on the electron beam irradiation target surface. Furthermore, there may be provided a plurality of electron beam irradiation tubes corresponding to sizes and dimensions of the irradiation target object 2 and of the irradiation target surface of the disc-shaped medium 49.

Furthermore, the gas to be replaced with the atmospheres within the chamber and within the electron beam irradiation apparatus is not limited to the nitrogen gas, wherein an inert gas such as an argon gas, a helium gas, etc. is available, and a mixture gas of these two or more types of gases is also available.

What is claimed is:

1. An apparatus for manufacturing a disc-shaped object, comprising:
    an electron beam irradiation apparatus including a first rotational unit provided in an openable/closable shield container and accommodating a disc-shaped object rotationally driven, and an electron beam irradiation unit for irradiating the surface of said on-rotating disc-shaped object with electron beams;
    a chamber including a second rotational unit capable of accommodating said disc-shaped object and an exchange chamber that is air-tightly closable and openable/closable independently of said shield container; and
    a rotational unit for exchanging said first and second rotational units with each other by rotating said first rotational unit in said shield container and said second rotational unit in said exchange chamber,
    wherein said electron beam irradiation unit and said disc-shaped object are relatively moved when irradiating said on-rotating disc-shaped object with the electron beams.

2. An apparatus for manufacturing a disc-shaped object according to claim 1, wherein a width of said electron beam irradiation unit in a direction orthogonal to a rotating direction of said irradiation target object within a rotating plane of said disc-shaped object, is smaller than a radius of said disc-shaped object.

3. An apparatus for manufacturing a disc-shaped object according to claim 1, wherein a rotating speed of said disc-shaped object is changed corresponding to a position of the irradiation by said electron beam irradiation unit over said disc-shaped object.

4. An apparatus for manufacturing a disc-shaped object according to claim 3, wherein said first rotational unit and said second rotational unit are so constructed as to be capable of revolving, and said first rotational unit irradiates the surface of said on-rotating disc-shaped object with the electron beams from said electron beam irradiation unit.

5. An apparatus for manufacturing a disc-shaped object according to claim 3, wherein the rotating speed of said disc-shaped object is decreased when said electron beam irradiation unit irradiates an outer periphery side of said disc-shaped object with the electron beams and is increased when irradiating an inner periphery side with the electron beams.

6. An apparatus for manufacturing a disc-shaped object according to claim 1, wherein a moving velocity of said electron beam irradiation unit is changed corresponding to the position of the irradiation by said electron beam irradiation unit over said disc-shaped object.

7. An apparatus for manufacturing a disc-shaped object according to claim 6, wherein the moving velocity of said electron beam irradiation unit is decreased when said electron beam irradiation unit irradiates the outer periphery side of said disc-shaped object with the electron beams and is increased when irradiating the inner periphery side with the electron beams.

8. An apparatus for manufacturing a disc-shaped object according to claim 1, wherein said electron beam irradiation unit comprises an irradiation window of a single electron beam irradiation tube.

* * * * *